United States Patent
Sato et al.

(10) Patent No.: US 7,974,051 B2
(45) Date of Patent: Jul. 5, 2011

(54) INTEGRATED CIRCUIT DEVICE AND ELECTRONIC INSTRUMENT

(75) Inventors: Shinya Sato, Suwa (JP); Takayuki Saiki, Suwa (JP); Hiroyuki Takamiya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 592 days.

(21) Appl. No.: 12/081,004

(22) Filed: Apr. 9, 2008

(65) Prior Publication Data
US 2008/0253045 A1 Oct. 16, 2008

(30) Foreign Application Priority Data
Apr. 12, 2007 (JP) .................................. 2007-105041

(51) Int. Cl.
*H02H 9/00* (2006.01)
(52) U.S. Cl. ........................ 361/56; 361/91.1; 361/111
(58) Field of Classification Search .................. 361/56, 361/91.1, 111
See application file for complete search history.

(56) References Cited

U.S. PATENT DOCUMENTS

| | | | | |
|---|---|---|---|---|
| 6,011,681 | A * | 1/2000 | Ker et al. | 361/111 |
| 7,365,573 | B2 * | 4/2008 | Okada | 326/86 |
| 7,417,837 | B2 * | 8/2008 | Chen | 361/56 |
| 7,551,055 | B2 * | 6/2009 | Lee | 338/48 |
| 2004/0075128 | A1 * | 4/2004 | Mizuno et al. | 257/300 |
| 2004/0120087 | A1 | 6/2004 | Ishii | |
| 2005/0128174 | A1 * | 6/2005 | Hung et al. | 345/100 |
| 2006/0077601 | A1 | 4/2006 | Ikeda et al. | |

FOREIGN PATENT DOCUMENTS

| | | |
|---|---|---|
| JP | A 2000-206177 | 7/2000 |
| JP | A-2000-269432 | 9/2000 |
| JP | A-2004-119883 | 4/2004 |
| JP | A 2006-100606 | 4/2006 |
| JP | A-2006-319268 | 11/2006 |

OTHER PUBLICATIONS

U.S. Appl. No. 12/081,008, filed Apr. 9, 2008 by Shinya Sato et al.

* cited by examiner

*Primary Examiner* — Jared J Fureman
*Assistant Examiner* — Christopher J Clark
(74) *Attorney, Agent, or Firm* — Oliff & Berridge PLC

(57) ABSTRACT

An interface circuit is provided between a first circuit block and a second circuit block that operates using a power supply system differing from that of the first circuit block. An electrostatic discharge protection circuit that include a PN diode and a diffused resistor is formed in order to prevent electrostatic discharge destruction of a gate insulating film of a transistor that forms the interface circuit. The electrostatic discharge protection circuit may be formed using the remaining basic cells of a gate array that forms the second circuit block. An electrostatic discharge protection circuit formed of a bidirectional diode may be connected between a first low-potential power supply and a second low-potential power supply.

10 Claims, 24 Drawing Sheets

INTEGRATED CIRCUIT DEVICE AND ELECTRONIC INSTRUMENT

Japanese Patent Application No. 2007-105041 filed on Apr. 12, 2007, is hereby incorporated by reference in its entirety.

BACKGROUND OF THE INVENTION

The present invention relates to an integrated circuit device with improved electrostatic discharge protection (electrostatic discharge resistance), and an electronic instrument.

Along with an increase in the degree of integration and scaling down of integrated circuit devices (ICs), measures to prevent electrostatic discharge destruction (breakdown) have become increasingly important. Therefore, the IC manufacturer is required to produce highly reliable products which can pass a severe electrostatic discharge destruction test (e.g., JP-A-2000-206177).

JP-A-2006-100606 discloses an electrostatic protection circuit provided between circuits which differ in power supply system, for example.

The inventors of the invention discovered the following. For example, an interface circuit formed using a low-voltage transistor that operates utilizing a 1.8 V power supply is provided between a first circuit block formed using a low-voltage transistor that operates utilizing a 1.8 V power supply and a second circuit block formed using a low-voltage transistor that operates utilizing a 1.8 V power supply in another system. In this case, when static electricity of different polarities is applied between a power supply node of the first circuit block and a power supply node of the second circuit block, a gate insulating film of an insulated gate transistor which forms the interface circuit may break through a special electrostatic discharge destruction mechanism.

In one example of the new electrostatic discharge destruction mechanism discovered by the inventors, a first circuit block operates using a first high-potential power supply and a first low-potential power supply, a second circuit block operates using a second high-potential power supply and a second low-potential power supply, and the first circuit block and the second circuit block transmit signals through a buffer circuit that includes a pair of input/output buffers which operate using different power supply systems (i.e., first and second power systems). In this case, at least one of a first buffer circuit which contributes to signal transmission from the first circuit block to the second circuit block and a second buffer circuit which contributes to signal transmission from the second circuit block to the first circuit block is provided. For example, a positive electrostatic surge current is applied to the first high-potential power supply, and a negative electrostatic surge current is applied to the second low-potential power supply. Note that a positive electrostatic surge current may be applied to the second high-potential power supply, and a negative electrostatic surge current may be applied to the first low-potential power supply.

According to one example of the new electrostatic discharge destruction mechanism, the electrostatic surge energy partially flows through the buffer circuit which includes the pair of input/output buffers (i.e., flows through a normal signal transmission route), whereby the gate insulating film of the transistor which forms the input buffer tends to break. This electrostatic discharge destruction mechanism also relates to an electrostatic discharge protection circuit inserted between the low-potential power supplies, inter-power-supply protection circuits respectively provided for different power supply systems, and the like.

It is necessary to provide an additional element when providing an electrostatic discharge protection circuit aimed at electrostatic discharge protection. This increases the degree of complexity and the area of the circuit.

It is necessary to optimize an electrostatic discharge protection circuit in order to efficiently prevent electrostatic discharge destruction. In this case, optimization of the electrostatic discharge protection may become difficult due to limitations relating to the layout or the production process, for example.

In particular, it is important to reasonably dispose an electrostatic discharge protection circuit optimized while suppressing an increase in area at an effective position of a minute integrated circuit device (IC). It is difficult to deal with such a demand using related-art technology.

SUMMARY

According to one aspect of the invention, there is provided an integrated circuit device comprising:

a first circuit block;

a second circuit block that operates using a power supply system differing from that of the first circuit block; and an interface circuit provided between the first circuit block and the second circuit block, the first circuit block operating using a first high-potential power supply and a first low-potential power supply;

the second circuit block operating using a second high-potential power supply and a second low-potential power supply;

the interface circuit including at least either a first buffer circuit or a second buffer circuit;

the first buffer circuit including:

a first output buffer that buffers a signal from the first circuit block and outputs the buffered signal to a first signal path, the first output buffer operating using the first high-potential power supply and the first low-potential power supply;

a first input buffer that buffers a signal transmitted from the first output buffer through the first signal path and supplies the buffered signal to the second circuit block, the first input buffer operating using the second high-potential power supply and the second low-potential power supply;

a first PN diode provided between the first signal path and the second high-potential power supply;

a second PN diode provided between the first signal path and the second low-potential power supply; and a first electrostatic discharge protection resistor that is provided in the first signal path and formed by an impurity region; and the second buffer circuit including:

a second output buffer that buffers a signal from the second circuit block and outputs the buffered signal to a second signal path, the second output buffer operating using the second high-potential power supply and the second low-potential power supply;

a second input buffer that buffers a signal transmitted from the second output buffer through the second signal path and supplies the buffered signal to the first circuit block, the second input buffer operating using the first high-potential power supply and the first low-potential power supply;

a third PN diode provided between the second signal path and the first high-potential power supply;

a fourth PN diode provided between the second signal path and the first low-potential power supply; and a second electrostatic discharge protection resistor that is provided in the second signal path and formed by an impurity region.

According to another aspect of the invention, there is provided an electronic instrument comprising:
the above integrated circuit device; and
a display device driven by the integrated circuit device.

Figure 1:
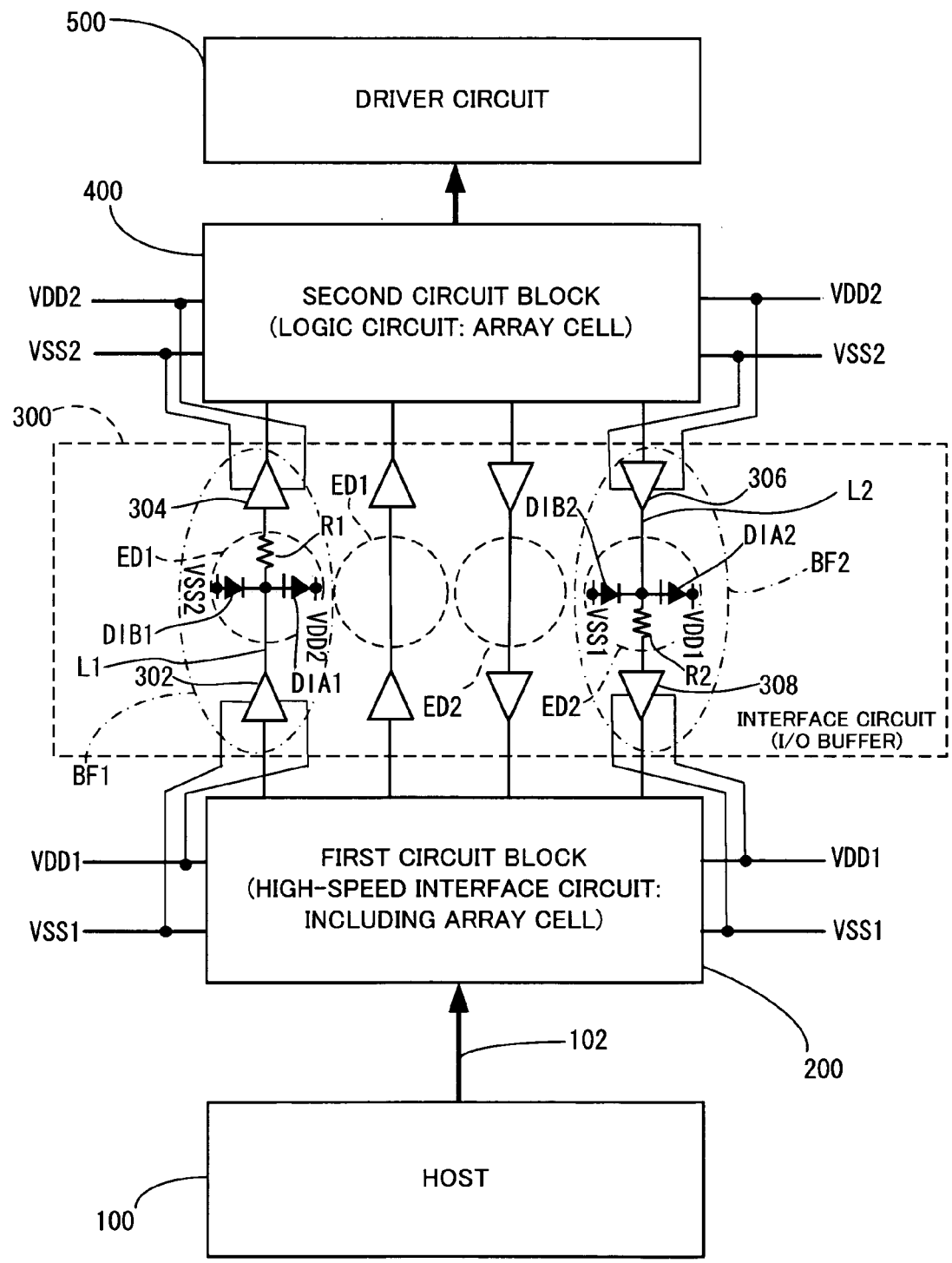
FIG. 1 is a view showing an example of the basic configuration of an integrated circuit device according to the invention.

DETAILED DESCRIPTION OF THE EMBODIMENT (1) According to one embodiment of the invention, there is provided an integrated circuit device comprising:
a first circuit block;
a second circuit block that operates using a power supply system differing from that of the first circuit block; and
an interface circuit provided between the first circuit block and the second circuit block,
the first circuit block operating using a first high-potential power supply and a first low-potential power supply;
the second circuit block operating using a second high-potential power supply and a second low-potential power supply;
the interface circuit including at least either a first buffer circuit or a second buffer circuit;
the first buffer circuit including:
a first output buffer that buffers a signal from the first circuit block and outputs the buffered signal to a first signal path, the first output buffer operating using the first high-potential power supply and the first low-potential power supply;
a first input buffer that buffers a signal transmitted from the first output buffer through the first signal path and supplies the buffered signal to the second circuit block, the first input buffer operating using the second high-potential power supply and the second low-potential power supply;
a first PN diode provided between the first signal path and the second high-potential power supply;
a second PN diode provided between the first signal path and the second low-potential power supply; and
a first electrostatic discharge protection resistor that is provided in the first signal path and formed by an impurity region; and
the second buffer circuit including:
a second output buffer that buffers a signal from the second circuit block and outputs the buffered signal to a second signal path, the second output buffer operating using the second high-potential power supply and the second low-potential power supply;
a second input buffer that buffers a signal transmitted from the second output buffer through the second signal path and supplies the buffered signal to the first circuit block, the second input buffer operating using the first high-potential power supply and the first low-potential power supply;

a third PN diode provided between the second signal path and the first high-potential power supply;

a fourth PN diode provided between the second signal path and the first low-potential power supply; and a second electrostatic discharge protection resistor that is provided in the second signal path and formed by an impurity region.

The electrostatic discharge protection circuit provided between the first circuit block and the second circuit block that operates using a power supply system differing from that of the first circuit block includes the PN diode connected to the high-potential power supply, the PN diode connected to the low-potential power supply, and the resistor formed by an impurity region (i.e., diffused resistor). Electrostatic energy can be released to the power supply potential utilizing the PN diode. Electrostatic energy can be attenuated by the diffused resistor inserted into the signal path. This effectively prevents electrostatic discharge destruction of a transistor which occurs in the interface circuit (particularly the input buffer) between circuit blocks that operate using different power supplies.

(2) In the integrated circuit device according to this embodiment, the integrated circuit device may further include an electrostatic discharge protection circuit for noise blocking and electrostatic discharge protection that is provided between the first low-potential power supply and the second low-potential power supply, the electrostatic discharge protection circuit may include a bidirectional diode formed by connecting at least one fifth diode and at least one the sixth diode in parallel, a forward direction of the at least one fifth diode being a direction from a power supply node connected to the first low-potential power supply to a power supply node connected to the second low-potential power supply, and a forward direction of the at least one sixth diode being a direction from the power supply node connected to the second low-potential power supply to the power supply node connected to the first low-potential power supply.

The electrostatic discharge protection circuit formed of the bidirectional diode is provided between the power supply node connected to the first low-potential power supply and the power supply node connected to the second low-potential power supply. The bidirectional diode is formed by connecting, in parallel, at least two diodes having opposite forward directions. A plurality of diodes having an identical forward direction may be connected in series.

The electrostatic discharge protection circuit forms an electrostatic energy (electrostatic surge current) discharge path when a positive or negative electrostatic voltage is applied between the first high-potential power supply of the first circuit block and the second low-potential power supply of the second circuit block. This prevents a situation in which the entire electrostatic surge energy is directly applied to the gate of the insulated gate transistor which forms the interface circuit. The electrostatic discharge protection circuit also has a function of preventing transmission of noise between the power supply node connected to the first low-potential power supply and the power supply node connected to the second low-potential power supply. Specifically, a small change in potential which occurs at one power supply node is blocked by the bidirectional diode and is not transmitted to the other power supply node.

This configuration effectively prevents electrostatic discharge destruction of the gate insulating film of the interface circuit provided between circuits that differ in power supply system due to a special electrostatic discharge destruction mechanism.

(3) In the integrated circuit device according to this embodiment, the integrated circuit device may further include:

a first inter-power-supply protection element provided between a power supply node connected to the first high-potential power supply and a power supply node connected to the first low-potential power supply; and a second inter-power-supply protection element provided between a power supply node connected to the second high-potential power supply and a power supply node connected to the second low-potential power supply.

Since the first inter-power-supply protection element is provided, a discharge path is formed when static electricity is applied between the power supplies of the first circuit block, whereby a surge current can be bypassed. Therefore, the first circuit block can be protected against electrostatic discharge destruction. Likewise, since the second inter-power-supply protection element is provided, a discharge path is formed when static electricity is applied between the power supplies of the second circuit block, whereby a surge current can be bypassed. Therefore, the second circuit block can be protected against electrostatic discharge destruction.

(4) In the integrated circuit device according to this embodiment, the second circuit block may be a circuit block that includes a circuit formed using a semi-custom IC design method that designs a desired circuit by connecting a plurality of basic cells through wires;

each of the plurality of basic cells may include circuit elements that include at least:

a first-conductivity-type well region;

a second-conductivity-type well region;

a second-conductivity-type diffusion layer provided in the first-conductivity-type well region;

a first-conductivity-type diffusion layer provided in the second-conductivity-type well region; and at least one gate electrode layer; and each of the first PN diode, the second PN diode, and the first electrostatic discharge protection resistor included in the first buffer circuit may be formed using at least one circuit element among the circuit elements included in each of the plurality of basic cells for the second circuit block.

The PN diode and the diffused resistor included in the first buffer circuit can be formed using the basic cell for the second circuit block including a circuit designed using a semi-custom IC design method (array-cell method). The semi-custom IC includes an array-cell circuit such as a gate array, an embedded array, or a standard cell. The second circuit block is formed by a gate array, for example. A variety of basic cells are provided for the gate array, and a number of basic cells remain unused in a normal circuit configuration. Therefore, an electrostatic discharge protection circuit having necessary characteristics can be reasonably designed without increasing the circuit area by effectively utilizing the basic cells.

(5) In the integrated circuit device according to this embodiment, the first circuit block may be a circuit block that includes a circuit formed using a semi-custom IC design method that designs a desired circuit by connecting a plurality of basic cells through wires;

each of the plurality of basic cells may include circuit elements that include at least:

a first-conductivity-type well region;

a second-conductivity-type well region;

a second-conductivity-type diffusion layer provided in the first-conductivity-type well region;

a first-conductivity-type diffusion layer provided in the second-conductivity-type well region; and at least one gate electrode layer; and each of the third PN diode, the fourth PN diode, and the second electrostatic discharge protection resistor included in the second buffer circuit may be formed using at least one circuit element among the circuit elements included in each of the plurality of basic cells for the first circuit block.

The above statement defines that the PN diode and the diffused resistor included in the second buffer circuit are formed using the basic cell for the first circuit block including a circuit designed using a semi-custom IC design method (array-cell method). The semi-custom IC includes an array-cell circuit such as a gate array, an embedded array, or a standard cell. The second circuit block is formed by a gate array, for example. A variety of basic cells are provided for the gate array, and a number of basic cells remain unused in a normal circuit configuration. Therefore, an electrostatic discharge protection circuit having necessary characteristics can be reasonably designed without increasing the circuit area by effectively utilizing the basic cells.

(6) In the integrated circuit device according to this embodiment, the first-conductivity-type well region may be formed in the second-conductivity-type well region;

the at least one gate electrode layer may be linearly provided along a first direction over the second-conductivity-type diffusion layer provided in the first-conductivity-type well region and the first-conductivity-type diffusion layer provided in the second-conductivity-type well region;

a wiring layer that forms the first signal path or the second signal path may includes a first wiring portion and a second wiring portion that are electrically connected and provided in parallel to the at least one gate electrode layer and;

the first wiring portion may be connected to the second-conductivity-type diffusion layer provided in the first-conductivity-type well region through a plurality of contacts, an end of the first wiring portion being connected to the first-conductivity-type diffusion layer provided in the second-conductivity-type well region through a contact in a number smaller than a number of the plurality of contacts;

an end of the second wiring portion may be connected to the first-conductivity-type diffusion layer provided in the second-conductivity-type well region through at least one contact;

the PN diode included in the first buffer circuit or the second buffer circuit may be formed using a junction between the first-conductivity-type well region and the second-conductivity-type diffusion layer or a junction between the second-conductivity-type well region and the first-conductivity-type diffusion layer; and the first electrostatic discharge protection resistor or the second electrostatic discharge protection resistor may be formed using the first-conductivity-type diffusion layer provided in the second-conductivity-type well region or the second-conductivity-type diffusion layer provided in the first-conductivity-type well region as a diffused resistor.

The above statement defines an example of an optimum layout when reasonably forming the most compact electrostatic discharge protection circuit (including the PN diodes and the diffused resistor) by effectively utilizing the basic cell. Moreover, the contact area can be increased by increasing the number of contacts connected to the first wiring portion, whereby a large electrostatic energy can be quickly released to the power supply potential.

(7) In the integrated circuit device according to this embodiment, an interval between the plurality of contacts that connect the first wiring portion of the wiring layer with the second-conductivity-type diffusion layer provided in the first-conductivity-type well region may be smaller than an interval between the contact that connects the end of the first wiring portion with the first-conductivity-type diffusion layer provided in the second-conductivity-type well region and the contact that connects the end of the second wiring portion with the first-conductivity-type diffusion layer.

The above statement defines that the interval between the contacts for quickly releasing a large electrostatic energy to the power supply potential is set to be smaller than the interval between the contacts connected to the diffused resistor. Moreover, the contact area can be increased by densely disposing the contacts connected to the first wiring portion, whereby a large electrostatic energy can be quickly released to the power supply potential. On the other hand, a sufficient resistance can be ensured by increasing the interval between the contacts connected to the diffused resistor.

(8) In the integrated circuit device according to this embodiment, a gate insulating film of a transistor that forms the first input buffer or the second input buffer may have a thickness larger than a thickness of a gate insulating film of at least one transistor that forms the first circuit block or the second circuit block.

Reliable measures to prevent electrostatic discharge are achieved by providing the electrostatic discharge protection circuit (including the PN diodes and the diffused resistor) while reasonably improving electrostatic discharge protection by increasing the thickness of the gate insulating film of the transistor susceptible to electrostatic discharge destruction.

(9) In the integrated circuit device according to this embodiment, a first-conductivity-type transistor that forms the first circuit block may be formed in a second-conductivity-type well;

a second-conductivity-type transistor that forms the first circuit block may be formed in a first first-conductivity-type well, the first first-conductivity-type well being formed on a second-conductivity-type substrate to enclose the second-conductivity-type well;

a second-conductivity-type transistor that forms the second circuit block may be formed in a second first-conductivity-type well that differs from the first first-conductivity-type well of the first circuit block; and a first-conductivity-type transistor that forms the second circuit block may be formed on the second-conductivity-type substrate.

The integrated circuit device according to this embodiment employs a triple-well structure. The circuit according to the invention is formed on the assumption that the first circuit and the second circuit operate using different power supply systems. A plurality of circuits that operate using different power supply systems can be reasonably formed in a compact manner using the triple-well structure.

According to the triple-well structure, the transistors of the first circuit block and the transistors of the second circuit block can be electrically separated by a barrier (diode) formed between a second-conductivity-type substrate (e.g., PSUB) and a first first-conductivity-type well (e.g., N-well). This makes it possible to adjacently provide the first circuit block and the second circuit block while electrically separating the first circuit block and the second circuit block.

(10) In the integrated circuit device according to this embodiment, the first circuit block may be a high-speed interface circuit block that transfers data through a serial bus;

the high-speed interface circuit block may include a physical layer circuit that includes an analog circuit, and a logic circuit; and the second circuit block may be a driver logic circuit block that generates a display control signal that drives a display device.

The above statement defines that the invention may be applied to the liquid crystal display device driver IC.

(11) According to another embodiment of the invention, there is provided an electronic instrument comprising:

the above integrated circuit device; and a display device driven by the integrated circuit device.

The above integrated circuit device has a simple configuration, has effectively improved electrostatic discharge destruction protection, and exhibits high reliability. Therefore, the reliability of the electronic instrument including the integrated circuit device is also improved.

According to several embodiments of the invention, electrostatic discharge protection of an integrated circuit device including an interface circuit provided between circuits that operate using different power supplies can be reasonably and effectively improved by a simple configuration, for example. Therefore, the reliability of the IC is improved.

Embodiments of the invention are described below. Note that the embodiments described below do not in any way limit the scope of the invention defined by the claims laid out herein. Note that all elements of the embodiments described below should not necessarily be taken as essential requirements for the invention.

Example of basic configuration of integrated circuit device according to the invention FIG. 1 is a view showing an example of the basic configuration of an integrated circuit device according to the invention.

The integrated circuit device shown in FIG. 1 includes a first circuit block (e.g., high-speed interface circuit block) 200 which receives an image signal (grayscale data) or a control signal transmitted from a host (e.g., host computer which controls the display operation of a liquid crystal display device) 100 through a serial communication line, a second circuit block 400 (e.g., logic circuit block) which operates using a power supply system differing from that of the first circuit block 200, an interface circuit 300 (hereinafter may be referred to as "I/O buffer 300") provided between the first circuit block 200 and the second circuit block 400 (i.e., provided between circuits that differ in power supply system), and a driver circuit (e.g., data line driver circuit of a liquid crystal display device) 500 of which the operation is controlled by the second circuit block (e.g., logic circuit) 400.

The second circuit block 400 is a circuit designed using a semi-custom IC design method (e.g., gate array) (method which efficiently designs a circuit utilizing basic cells). Such a circuit may be hereinafter referred to as a combination of "array cells". The first circuit block 200 also includes a circuit (array cells) designed using a semi-custom IC design method (e.g., gate array) (i.e., the first circuit block 200 may be entirely or partially formed using array cells).

The first circuit block 200, the interface circuit (I/O buffer) 300, and the second circuit block 400 are low-voltage circuits (e.g., 1.8 V circuits) formed using a low-voltage transistor (LVTr). The driver circuit 500 is a medium-voltage circuit or a high-voltage circuit. The breakdown voltage of the medium-voltage circuit is set to be higher than that of the low-voltage circuit. The breakdown voltage of the high-voltage circuit is set to be higher than that of the medium-voltage circuit.

The first circuit block 200 operates using a first high-potential power supply VDD1 and a first low-potential power supply VSS1. The second circuit block 400 operates using a second high-potential power supply VDD2 and a second low-potential power supply VSS2. The second high-potential power supply VDD2 is a power supply in a system differing from that of the first high-potential power supply voltage VDD1 and is independent of the first high-potential power supply voltage VDD1. The second low-potential power supply VSS2 is a power supply in a system differing from that of the first low-potential power supply VSS1 and is independent of the first low-potential power supply VSS1.

The interface circuit (I/O buffer) 300 provided between circuits that operate using different power supplies includes a first buffer circuit BF1 which provides a signal path from the first circuit block 200 to the second circuit block 400, and a second buffer circuit BF2 which provides a signal path from the second circuit block 400 to the first circuit block 200.

The first buffer circuit BF1 includes an output buffer 302 which receives a signal from the first circuit block 200, and an input buffer 304 which receives a signal from the output buffer 302. The output buffer 302 operates using the first high-potential power supply VDD1 and the first low-potential power supply VSS1. The input buffer 304 operates using the second high-potential power supply VDD2 and the second low-potential power supply VSS2.

The output buffer 302 and the input buffer 304 are connected through a first signal path (hereinafter may be referred to as "signal line") L1. A first electrostatic discharge protection circuit ED1 is provided in the first signal path L1 (signal line).

The electrostatic discharge protection circuit ED1 includes a PN diode DIA1 connected between the signal line L1 and the second high-potential power supply (VDD2), a PN diode DIB1 connected between the signal line L1 and the second low-potential power supply (VSS2), and a diffused resistor (resistor formed by an impurity region) R1 provided in the middle of the signal line L1.

It is desirable to efficiently form the electrostatic discharge protection circuit ED1 utilizing a basic cell (unused basic cell) for the second circuit block 400.

Likewise, the second buffer circuit BF2 includes an output buffer 306 which receives a signal from the second circuit block 400, and an input buffer 308 which receives a signal from the output buffer 306.

The output buffer 306 operates using the second high-potential power supply VDD2 and the second low-potential power supply VSS2. The input buffer 308 operates using the first high-potential power supply VDD1 and the second low-potential power supply VSS1.

The output buffer 306 and the input buffer 308 are connected through a second signal path (hereinafter may be referred to as "signal line") L2. An electrostatic discharge protection circuit (ED2) is proved in the middle of the signal line L2.

The electrostatic discharge protection circuit ED2 includes a PN diode DIA2 connected between the signal line L2 and the first high-potential power supply (VDD1), a PN diode DIB2 connected between the signal line L2 and the first low-potential power supply (VSS1), and a diffused resistor (resistor formed by an impurity region) R2 provided in the middle of the signal line L2.

It is desirable to efficiently form the electrostatic discharge protection circuit ED2 utilizing a basic cell (unused basic cell) for the first circuit block 200.

The electrostatic discharge protection circuit (ED1 and ED2) allows electrostatic energy to be released to the power supply potential utilizing the PN diode (DIA and DIB). Moreover, electrostatic energy can be attenuated utilizing the diffused resistor (R1 and R2) provided in the middle of the signal line (L1 and L2).

The circuit according to the invention may include an electrostatic discharge protection circuit which includes a bidirectional diode (i.e., a diode formed by connecting, in parallel, at least two diodes having opposite forward directions) between the first low-potential power supply and the second low-potential power supply (VSS1 and VSS2). The details are described later in detail with reference to FIGS. 6 and 7.

Since the electrostatic discharge protection circuits ED1 and ED2 have an identical configuration, the following description focuses on the electrostatic discharge protection circuit (ED1).

The reasons that destruction of the gate insulating film of the interface circuit (I/O buffer) 300 easily occurs (new electrostatic discharge destruction mode) are given below. The following reasoning was arrived at by the inventors of the invention before completion of the invention.

New Electrostatic Discharge Destruction Mode

1. First Example

Figure 2:
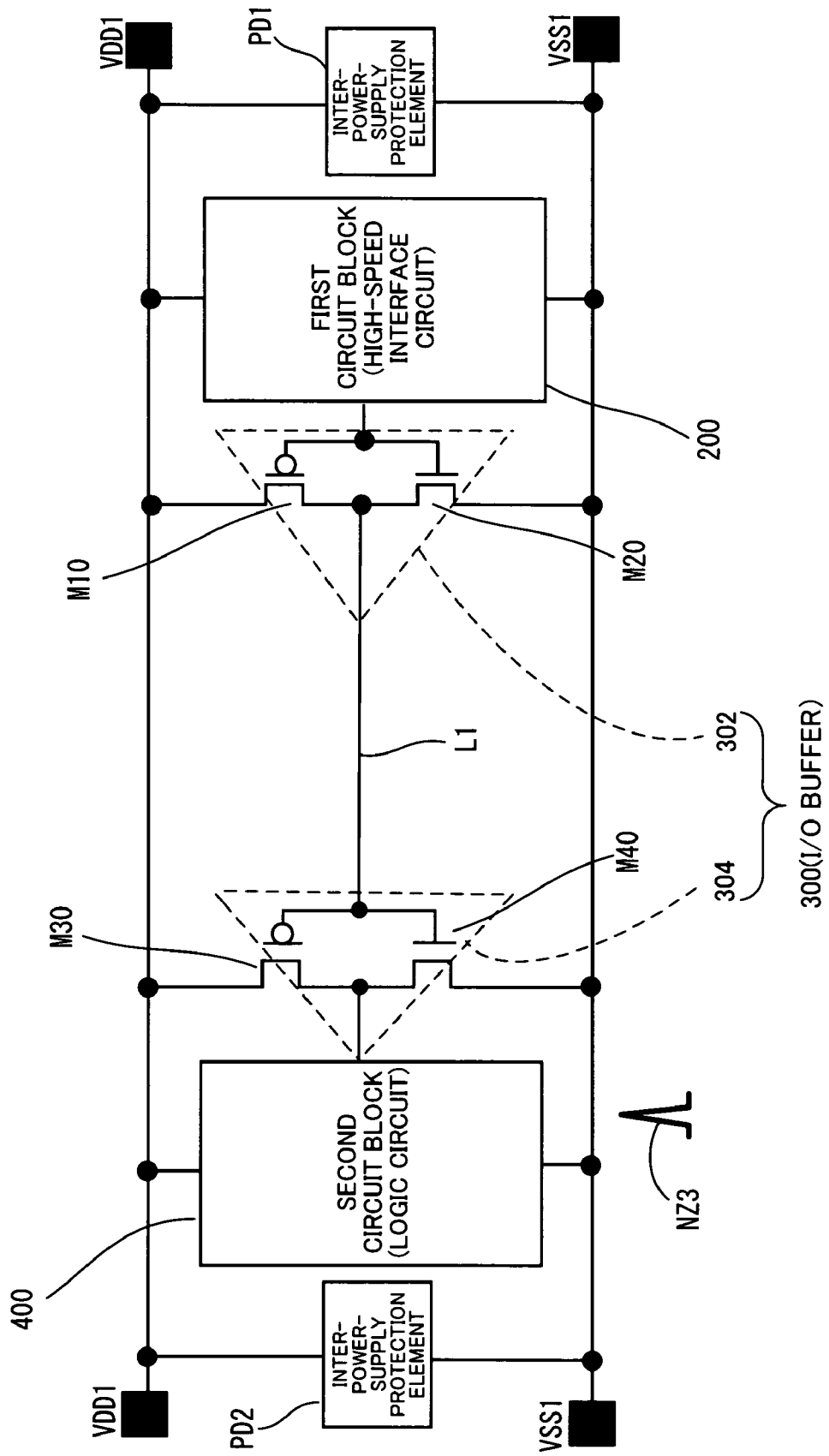
FIG. 2 is a circuit diagram showing a configuration example of an interface circuit (provided between circuits that differ in power supply system) according to a first example.

FIG. 2 is a circuit diagram showing a configuration example of an interface circuit (provided between circuits that differ in power supply system) according to a first example.

In the circuit shown in FIG. 2, the first circuit block 200, the second circuit block 400, and the I/O buffer 300 (including the input buffer 302 and the output buffer 304) operate using common power supply voltages (VDD1 and VSS1). The input buffer 302 includes a PMOS transistor M10 and an NMOS transistor M20. The output buffer 304 includes a PMOS transistor M30 and an NMOS transistor M40.

Inter-power-supply protection elements (PD1 and PD2) formed of a diode or a thyristor are provided between the first high-potential power supply (VDD1) and the first low-potential power supply (VSS1). When an electrostatic pulse is applied between the power supplies, the inter-power-supply protection elements (PD1 and PD2) are turned ON to form discharge paths so that electrostatic energy can be bypassed. This prevents electrostatic discharge destruction of the first circuit block and the second circuit block (200 and 400).

In the circuit shown in FIG. 2, power supply noise (NZ1) produced by the second circuit block 400 may adversely affect the operation of the first circuit block 200 (particularly the operation of the analog circuit), for example.

2. Second Example

Figure 3:
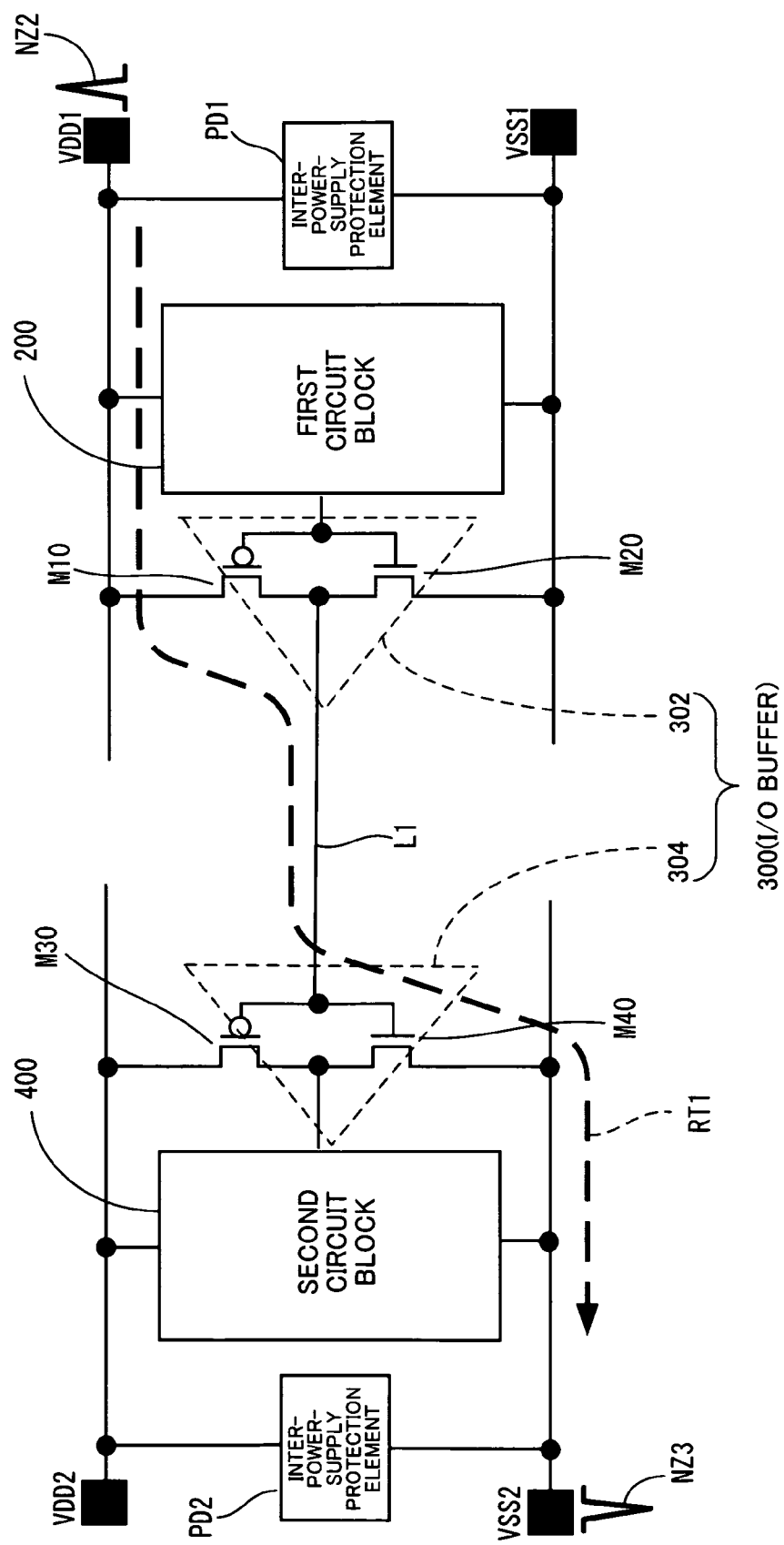
FIG. 3 is a circuit diagram showing a configuration example of an interface circuit (provided between circuits that differ in power supply system) according to a second example.

FIG. 3 is a circuit diagram showing a configuration example of an interface circuit (provided between circuits that differ in power supply system) according to a second example. In FIG. 3, the power supplies of the first circuit block 200 are completely separated from the power supplies of the second circuit block 400. Therefore, an adverse effect of power supply noise between the circuits does not occur, differing from FIG. 2.

However, when a positive electrostatic pulse (NZ2) is applied to a terminal connected to the first high-potential power supply (VDD1) and a negative electrostatic pulse (NZ3) is applied to a terminal connected to the second low-potential power supply (VSS2), a transient current (large amount of instantaneous current) due to static electricity flows through the signal line L1 along a route (RT1) indicated by a bold dotted line in FIG. 3. In this case, the gate insulating films of the PMOS transistor M30 and the NMOS transistor M40 (particularly the NMOS transistor M40 on the lower side) which form the input buffer 304 may break.

3. Third Example

Figure 4:
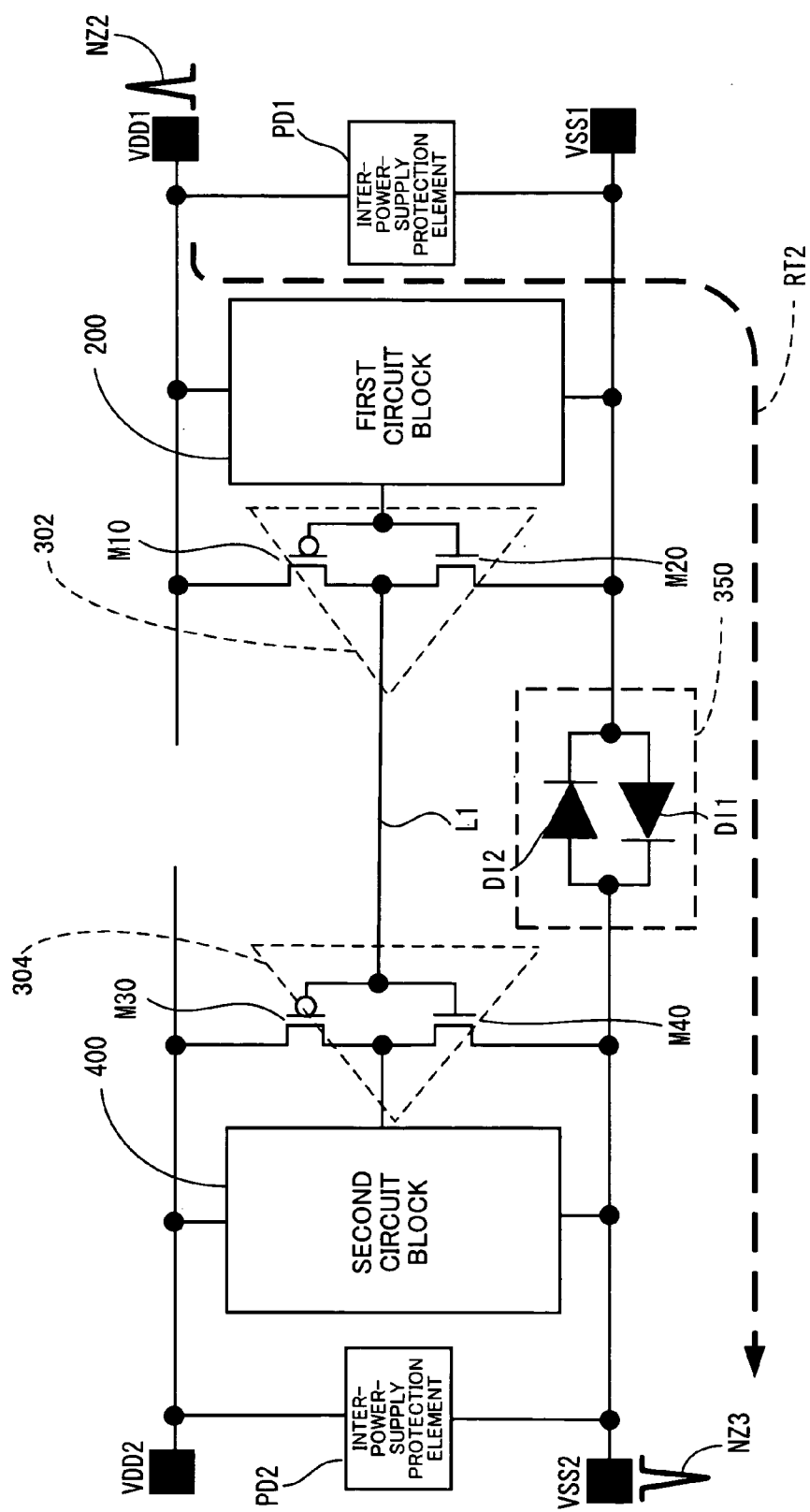
FIG. 4 is a circuit diagram showing a configuration example of an interface circuit (provided between circuits that differ in power supply system) according to a third example.

FIG. 4 is a circuit diagram showing a configuration example of an interface circuit (provided between circuits that differ in power supply system) according to a second example.

In FIG. 4, an electrostatic discharge protection circuit 350 including a bidirectional diode (i.e., a diode formed by connecting, in parallel, two diodes DI1 and DI2 having opposite forward directions) is provided between the first low-potential power supply and the second low-potential power supply (VSS1 and VSS2).

According to this configuration, when a positive electrostatic pulse (NZ2) is applied to the terminal connected to the first high-potential power supply (VDD1) and a negative electrostatic pulse (NZ3) is applied to the terminal connected to the second low-potential power supply (VSS2), the first diode DI1 is turned ON so that a discharge path is formed along a bypass route RT2 indicated by a bold dotted line in FIG. 4. Therefore, a transient current (large amount of instantaneous current) due to static electricity is discharged through the bypass route RT2. Since the bidirectional diode (DI1 and DI2) has a forward voltage of about 0.6 V, transmission of minute power supply noise is prevented due to the forward voltage which serves as a barrier.

According to the circuit shown in FIG. 4, destruction of the gate insulating films of the transistors (M30 and M40) which form the input buffer 304 would be prevented.

Figure 5:
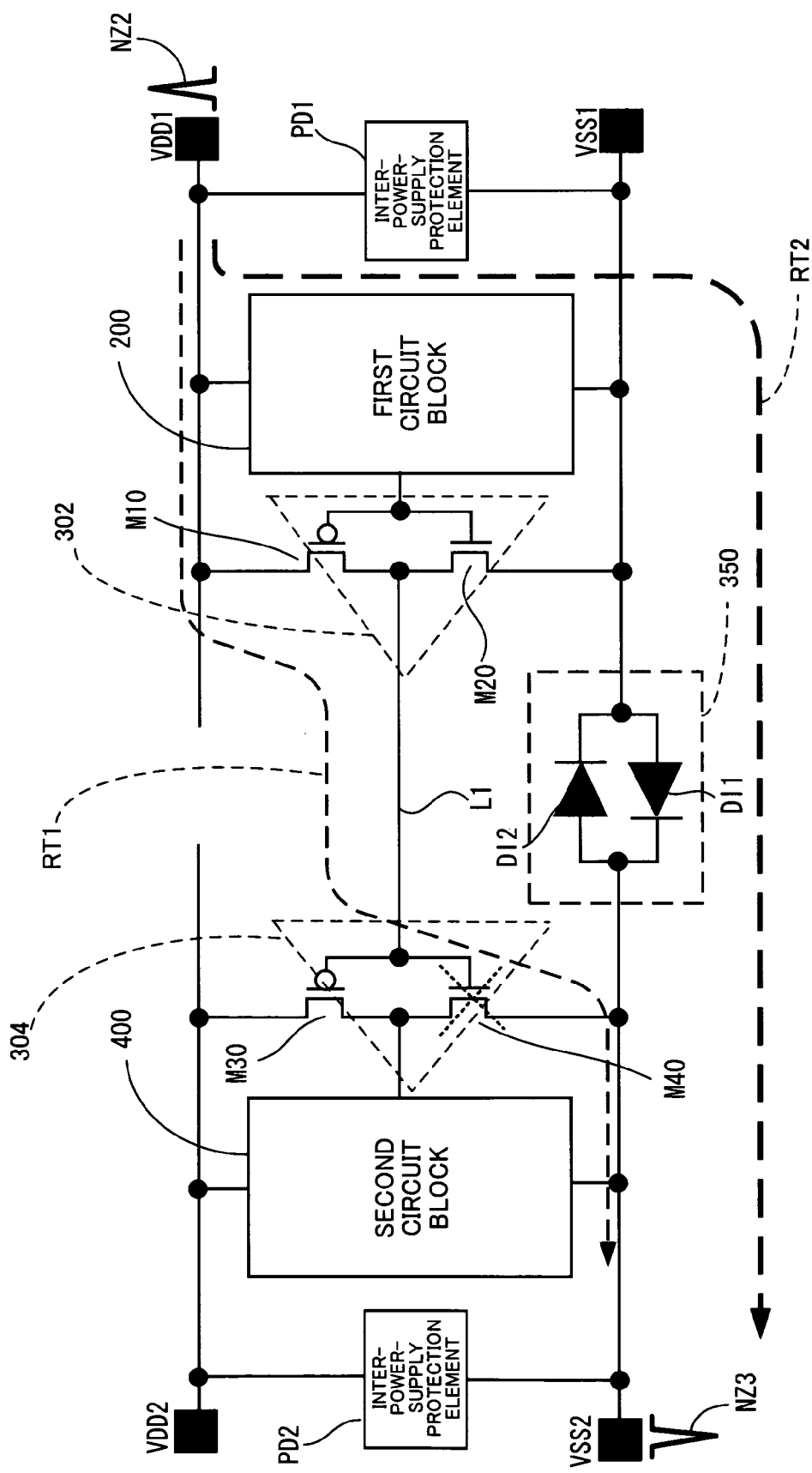
FIG. 5 is a view showing a new electrostatic discharge destruction mechanism of a gate insulating film of an interface circuit provided between circuits that differ in power supply system.

FIG. 5 is a view showing a newly discovered electrostatic discharge destruction mechanism of the gate insulating film of the interface circuit provided between circuits that differ in power supply system. In the actual situation, electrostatic surge energy partially flows through the normal signal line L1 along a route RT1 indicated by a dotted line in FIG. 5. Therefore, destruction (marked with "x" indicated by a dotted line in FIG. 5) of the gate insulating films of the transistors (M30 and M40) (particularly the NMOS transistor M40 on the lower side) which form the input buffer 304 may occur.

Specifically, electrostatic discharge destruction cannot be completely prevented by merely providing the electrostatic discharge protection circuit 350 including the bidirectional diode (DI1 and DI2) shown in FIG. 4.

According to the invention, the electrostatic discharge protection circuits (ED1 and ED2) (see FIG. 1) are provided in view of the above reasoning.

According to the invention, since the second circuit block 400 is designed using a semi-custom IC design method (e.g., gate array), the electrostatic discharge protection circuits (ED1 and ED2) may be formed using the remaining basic cells of a gate array. The details are described below.

First Embodiment

Figure 6:
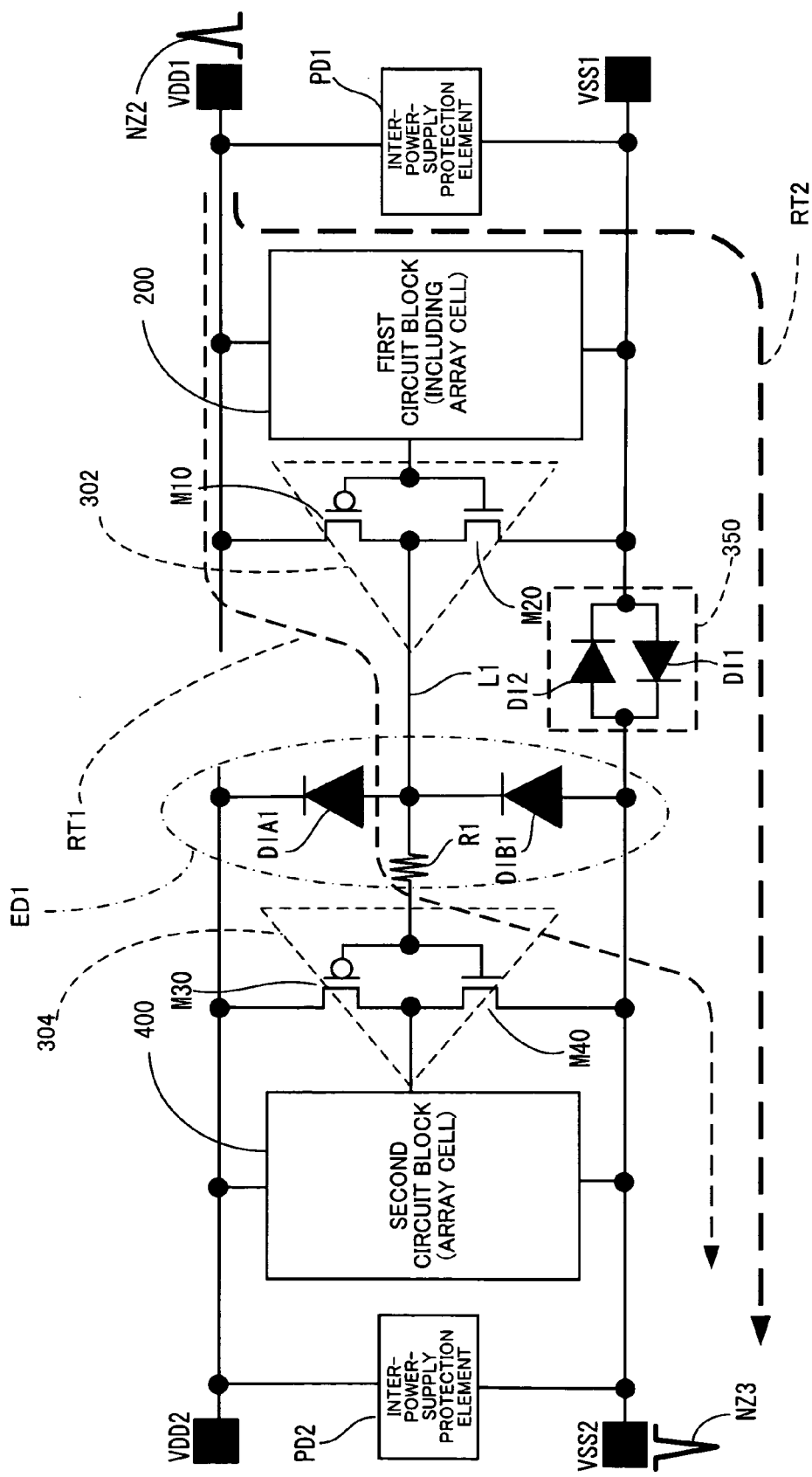
FIG. 6 is a circuit diagram illustrative of an example of a specific circuit configuration of an electrostatic discharge protection circuit provided in a first buffer circuit of an integrated circuit device according to the invention.

FIG. 6 is a circuit diagram illustrative of an example of a specific circuit configuration of the electrostatic discharge protection circuit provided in the first buffer circuit of the integrated circuit device according to the invention. In view of the above reasoning, the invention utilizes the electrostatic discharge protection circuit ED1 in the preceding stage of the input buffer 304 susceptible to electrostatic discharge destruction, as shown in FIG. 6.

The electrostatic discharge protection circuit ED1 includes the PN diode DIA1 connected between the signal line L1 and the second high-potential power supply (VDD2), the PN diode DIB1 connected between the signal line L1 and the second low-potential power supply (VSS2), and the diffused resistor (resistor formed by an impurity region) R1 provided (inserted) in the middle of the signal line L1. The resistor R1 functions as an electrostatic discharge protection resistor.

The PN diode DIA1 is turned ON when a positive surge current is applied to the signal line L1 to quickly release the surge current to the second high-potential power supply VDD2. The PN diode DIA2 is turned ON when a negative surge current is applied to the signal line L1 to quickly release the surge current to the second low-potential power supply VSS2. The electrostatic protection resistor R1 attenuates electrostatic surge energy, and weakens a sharp surge peak. Therefore, the transistors M30 and M40 are protected against electrostatic discharge destruction.

The bidirectional diode formed of the diodes DIA1 and DIB2 connected in parallel is connected between the first low-potential power supply and the second low-potential power supply (VSS1 and VSS2). The bidirectional diode forms the electrostatic discharge protection circuit 350.

The electrostatic discharge protection circuit 350 forms an electrostatic energy (electrostatic surge) discharge path indicated by a bold dotted arrow in FIG. 6 when a positive or negative electrostatic voltage is applied between the first high-potential power supply (VDD1) of the first circuit block 200 and the second low-potential power supply (VSS2) of the second circuit block 400. This prevents a situation in which the entire electrostatic surge energy is directly applied to the gates of the transistors (M30 and M40) which form the output buffer 304. The electrostatic discharge protection circuit 350 also has a function of preventing noise transmission between the first low-potential power supply and the second low-potential power supply (VSS1 and VSS2).

The configuration shown in FIG. 6 effectively prevents destruction of the gate insulating film of the interface circuit 300 provided between circuits that differ in power supply system caused by the special electrostatic discharge destruction mechanism shown in FIG. 5.

Since the electrostatic discharge protection circuit (ED1) can be formed utilizing the remaining basic cells of the gate array, the area of the integrated circuit device does not increase. Moreover, since an optimum design can be arbitrarily implemented based on the gate array design rule, a high-performance electrostatic discharge protection circuit (ED1 and ED2) can be efficiently formed.

Figure 7:
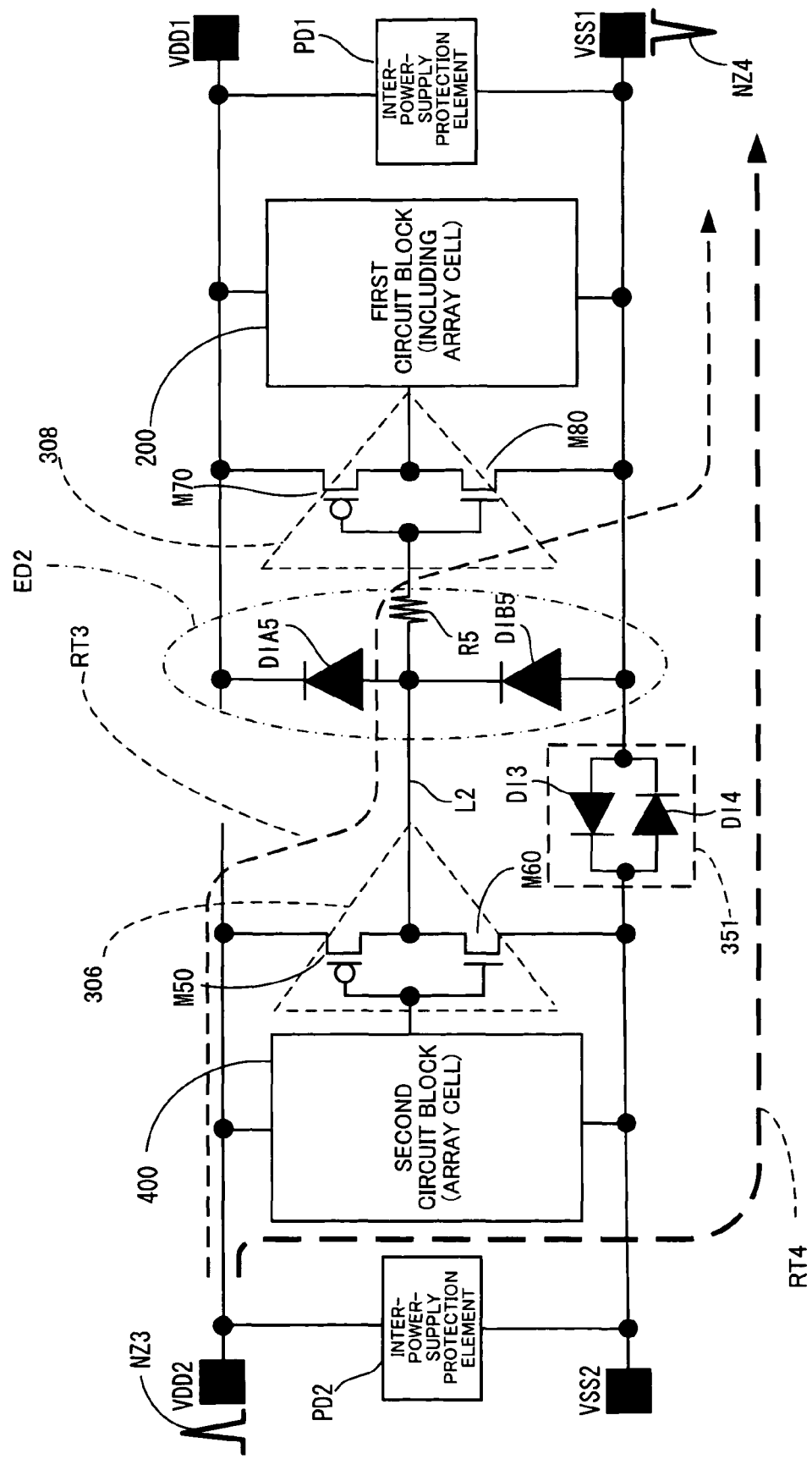
FIG. 7 is a circuit diagram illustrative of an example of a specific circuit configuration of an electrostatic discharge protection circuit provided in a second buffer circuit of an integrated circuit device according to the invention.

FIG. 7 is a circuit diagram illustrative of an example of a specific circuit configuration of the electrostatic discharge protection circuit provided in the second buffer circuit of the integrated circuit device according to this embodiment. As shown in FIG. 7, the second electrostatic discharge protection circuit ED2 included in the second buffer circuit BF2 (see FIG. 1) has the same configuration as that of the first electrostatic discharge protection circuit ED1 shown in FIG. 6.

Structure and Layout Example of PN Diode and Diffused Resistor

Figure 8A:
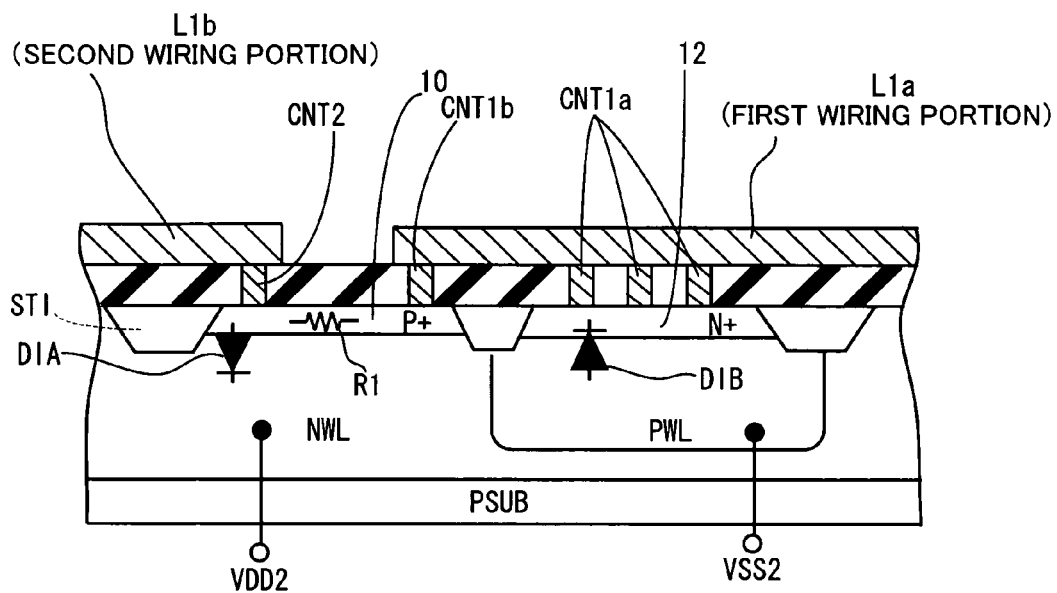
FIGS. 8A and 8B are cross-sectional views of a device showing the configuration of diodes and a resistor of an electrostatic discharge protection circuit.
Figure 8B:
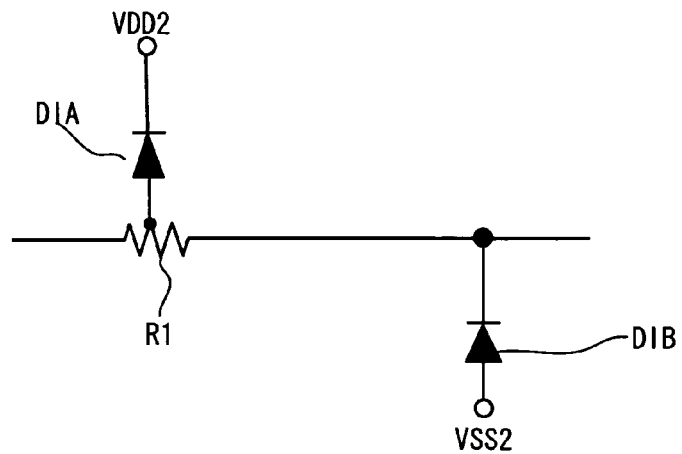

FIGS. 8A and 8B are cross-sectional views of the device showing the configuration of the diodes and the resistor of the electrostatic discharge protection circuit. FIG. 8B shows an equivalent circuit diagram of the device shown in FIG. 8A.

The electrostatic discharge protection circuit (ED1 and ED2) is formed using the basic cell (BC) of the gate array, as described above.

As shown in FIG. 8A, double wells (PWL and NWL) of opposite conductivity types are formed on a P-type substrate (PSUB). An N+ diffusion layer 12 is formed in the P-well (PWL), and a P+ diffusion layer 10 is formed in the N-well (NWL). The P-well (PWL) is connected to the second low-potential power supply VSS2, and the N-well (NWL) is connected to the second high-potential power supply VDD2.

A diode DIB is formed at the junction between the P-well (PWL) and the N+ diffusion layer 12, and a diode DIA is formed at the junction between the N-well (NWL) and the P+ diffusion layer 10. The resistor R1 is formed by a P+ layer 10.

The signal line L1 is divided into a first wiring portion L1a and a second wiring portion L1b. The first wiring portion L1a is connected to the N+ diffusion layer 12 through a plurality of contacts CNT1a.

The end of the first wiring portion L1a is connected to the P+ diffusion layer 10 through a contact CNT1b. The contact CNT1b may include one or more contact holes. When the contact CNT1b includes a plurality of contact holes, the number of contact holes of the contact CNT1b is smaller than the number of contact holes of the contacts CNT1a.

The end of the second wiring portion L1b is connected to the N+ diffusion layer 10 through at least one contact (CNT2). A substantial contact area is increased by increasing the number of contacts CNT1a, whereby large (excessive) electrostatic energy can be quickly released to the second low-potential power supply VSS2.

Figure 9:
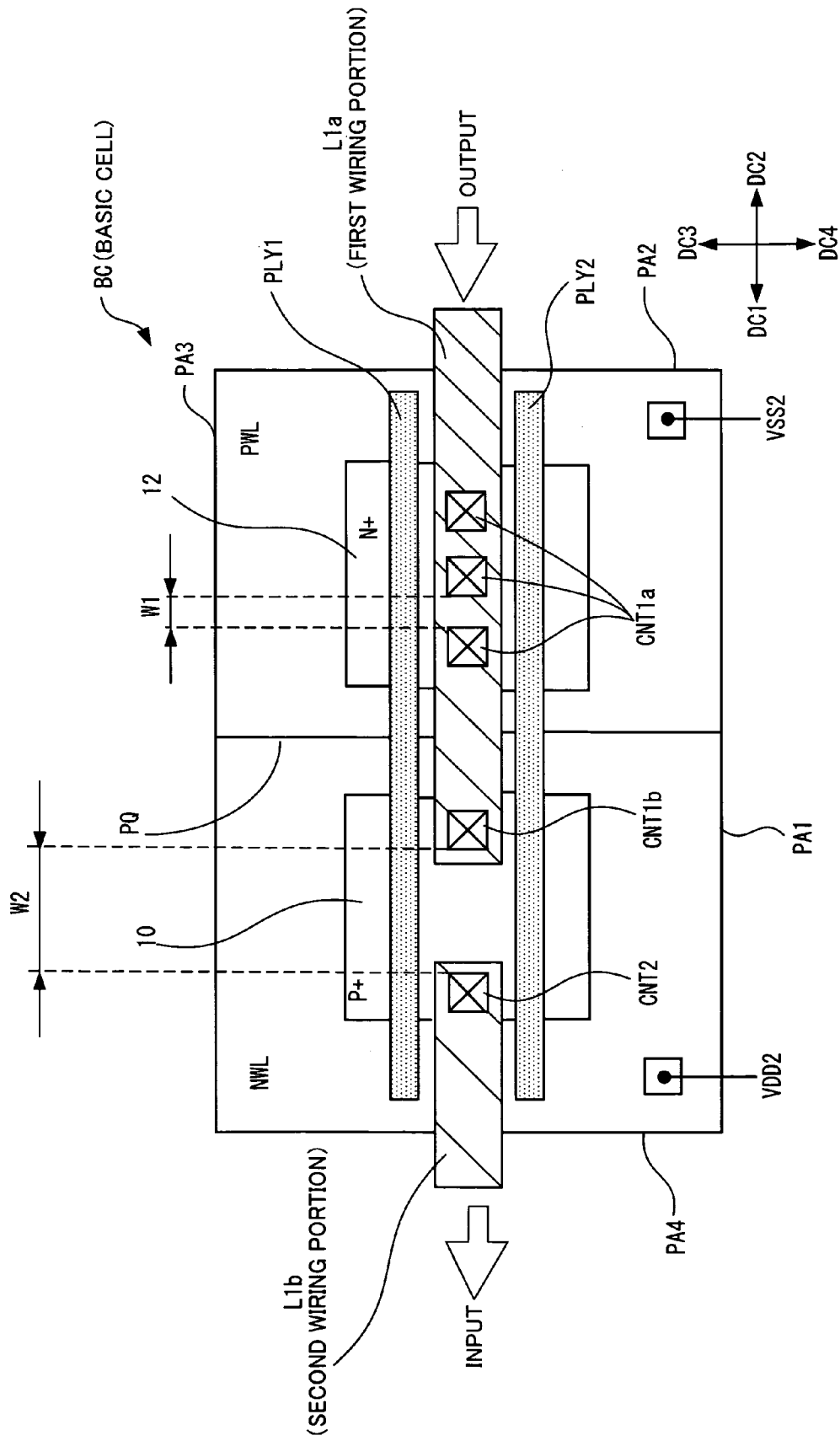
FIG. 9 is a view showing an example of the layout of the device shown in FIG. 8.

FIG. 9 is a view showing an example of the layout of the device shown in FIG. 8. In the layout shown in FIG. 9, the left side of the P-well (PWL) overlaps the right side of the N-well (NWL) (line segment PQ indicates the overlapping portion).

Two gate electrode layers (PLY1 and PLY2) are linearly provided over the N+ layer 12 provided in the P-well (PWL) and the P+ layer 10 provided in the N-well (NWL) along the direction (direction DC1) from a side PA2 toward a side PA4.

The first wiring portion L1a and the second wiring portion L1b of the signal line L1 are provided between the gate electrode layers (PLY1 and PLY2) along the same direction as that of the gate electrode layers (PLY1 and PLY2).

According to this configuration, the most compact electrostatic discharge protection circuit (including the PN diodes DIA and DIB and the diffused resistor R1) can be reasonably formed by effectively utilizing the basic cell (BC) of the gate array.

Moreover, the contact area is increased by increasing the number of contacts (CNT1a) connected to the first wiring portion (L1a), whereby a large electrostatic energy can be quickly released to the power supply potential.

The interval (W1) between the contacts (CNT1a) is sufficiently smaller than the interval (W2) between the contacts (CNT1b and CNT2) connected to the P+ layer 10. The contact area is increased by reducing the interval between the contacts to densely dispose the contacts, whereby a large electrostatic energy can be quickly released to the power supply potential.

The resistor R1 can be given a sufficient resistance by increasing the interval between the contacts (CNT1b and CNT2) connected to the P+ layer 10 (diffused resistor R1).

Figure 10:
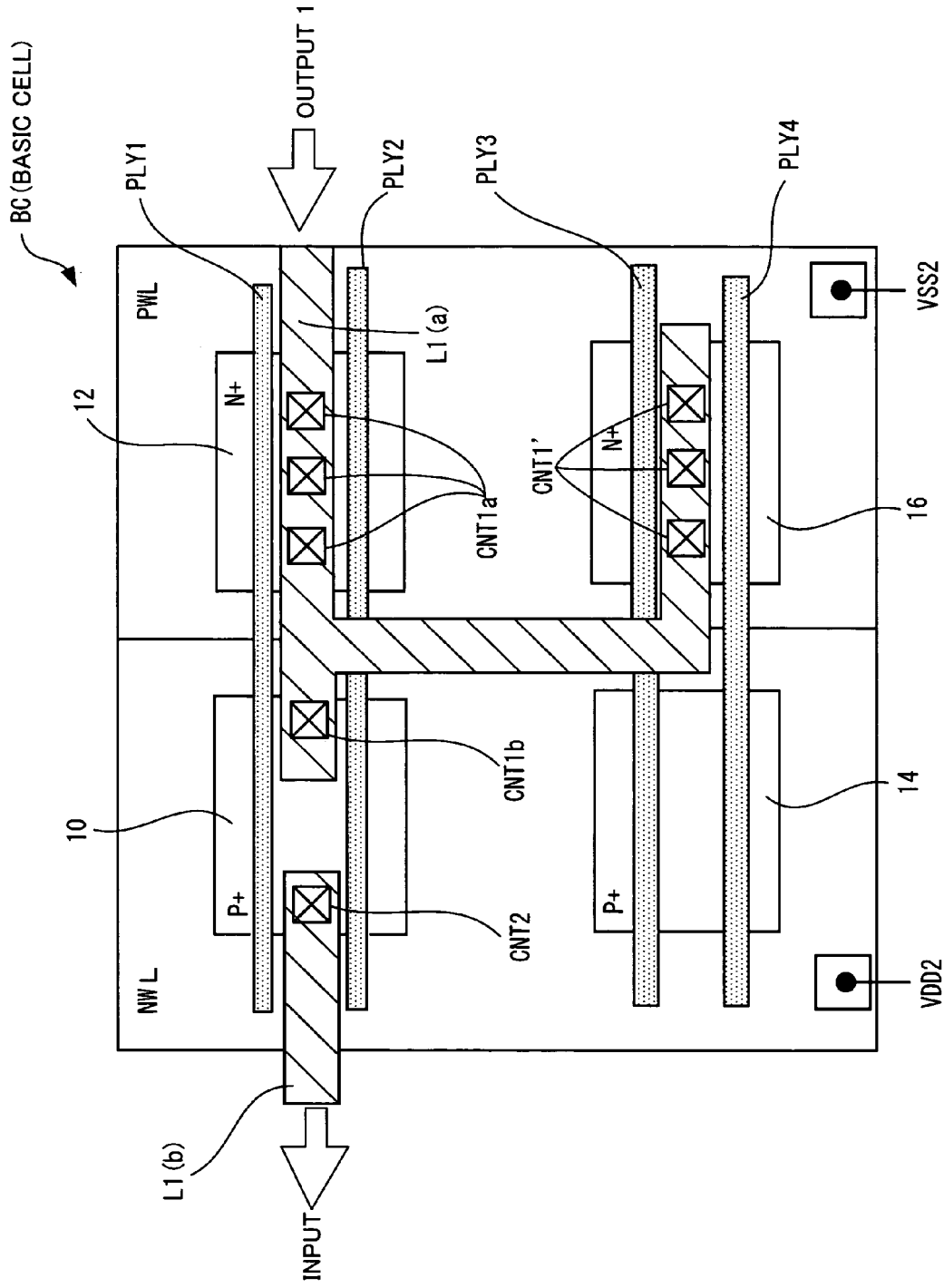
FIG. 10 is a view showing another example of the layout of the device shown in FIG. 8.

FIG. 10 is a view showing another example of the layout of the device shown in FIG. 8. FIG. 10 is characterized in that another basic cell is utilized to efficiently increase the number of contacts (CNT1a).

Specifically, the contact area is further increased by providing three contacts (CNT1') utilizing the other basic cell, whereby the capability of quickly releasing a large electrostatic energy to the power supply potential increases.

Figure 11A:
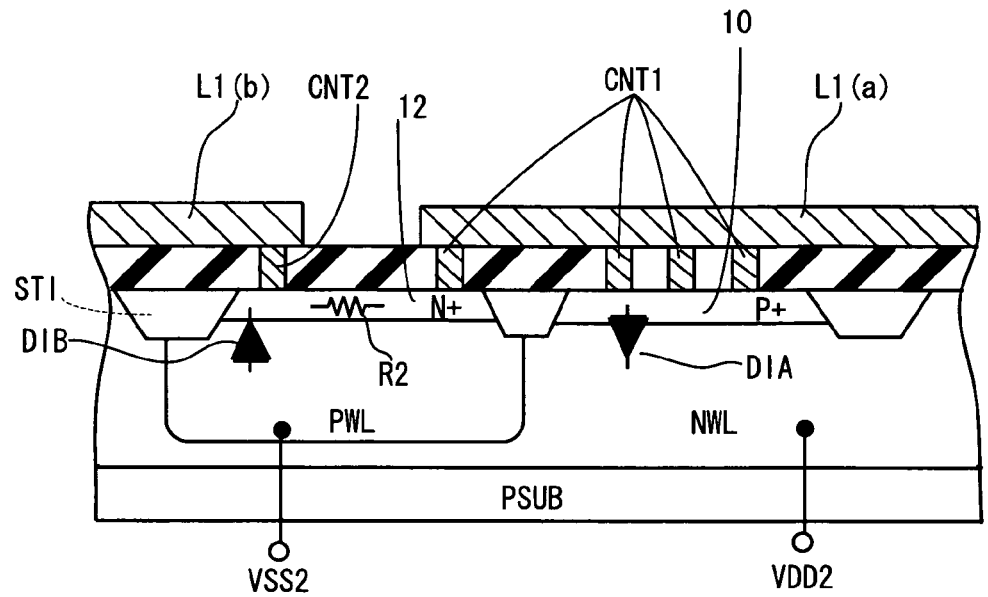
FIGS. 11A and 11B are cross-sectional views of a device showing another configuration of diodes and a resistor of an electrostatic discharge protection circuit.
Figure 11B:
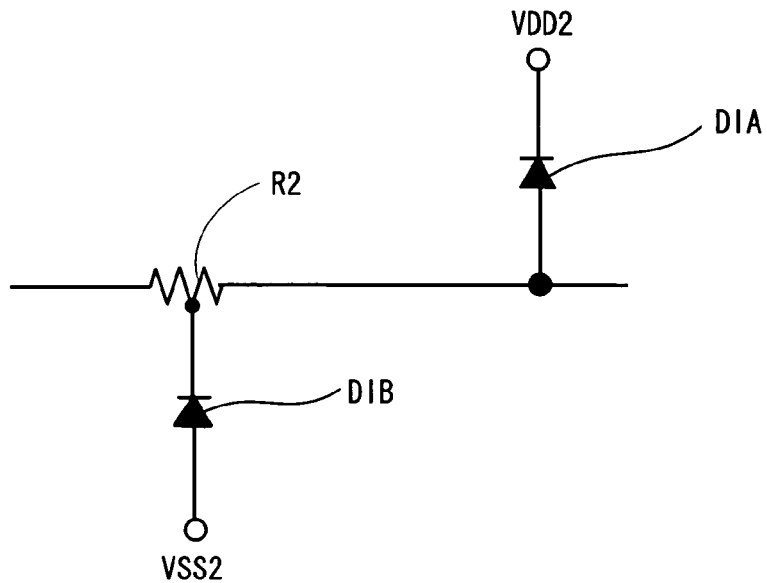

FIGS. 11A and 11B are cross-sectional views of the device showing another configuration of the diodes and the resistor of the electrostatic discharge protection circuit. FIG. 11B is an equivalent circuit diagram of the device shown in FIG. 11A. The configuration shown in FIG. 11A is substantially the same as the configuration shown in FIG. 8A except that each section of the device shown in FIG. 11A has a conductivity type which is the reverse of that of each section of the device shown in FIG. 8A.

Figure 12A:
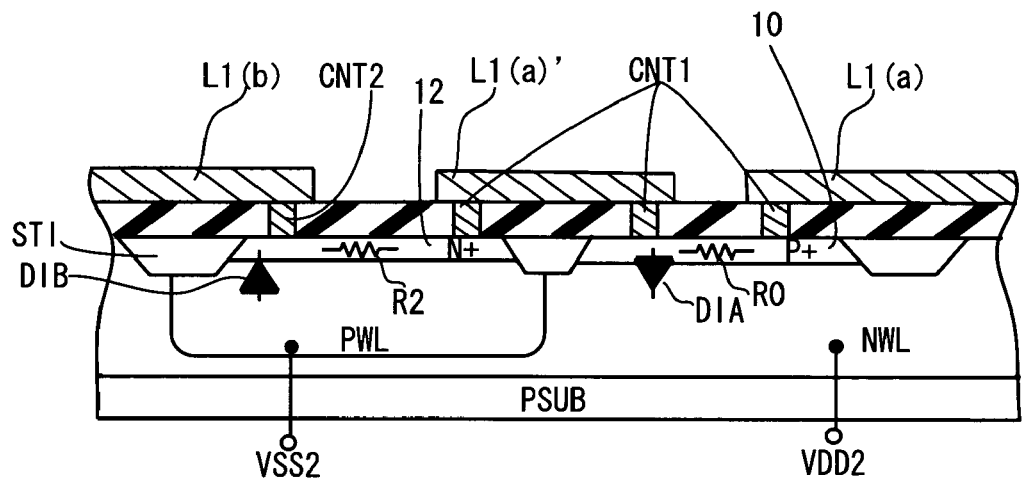
FIGS. 12A, 12B, and 12C are a cross-sectional view and equivalent circuit diagrams of a device showing a further configuration of diodes and a resistor of an electrostatic discharge protection circuit.
Figure 12B:
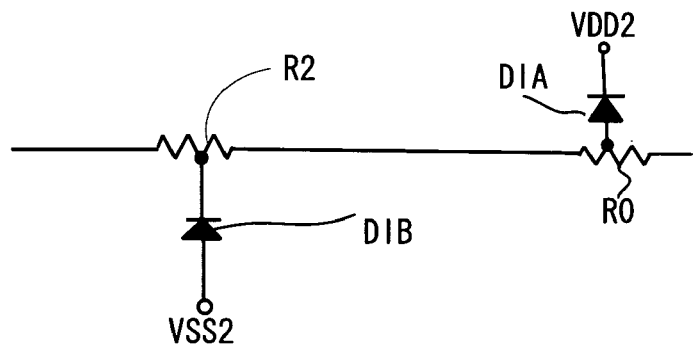
Figure 12C:
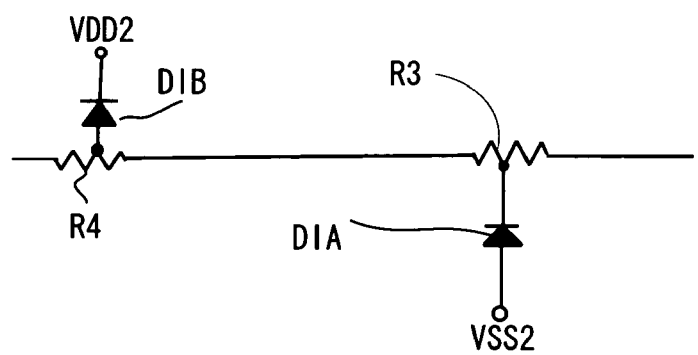

FIGS. 12A, 12B, and 12C are a cross-sectional view and equivalent circuit diagrams of the device showing a further configuration of the diodes and the resistor of the electrostatic discharge protection circuit. In FIG. 12A, two diodes (DIA and DIB) are respectively provided with a diffused resistor. In FIG. 12A, diffused resistors R0 and R2 are connected in series so that electrostatic surge energy is attenuated more effectively. FIG. 12B is an equivalent circuit diagram of the device shown in FIG. 12A. A structure shown in FIG. 12C may be used instead of the structure shown in FIG. 12B.

Configuration of Bidirectional Diode

Figure 13A:
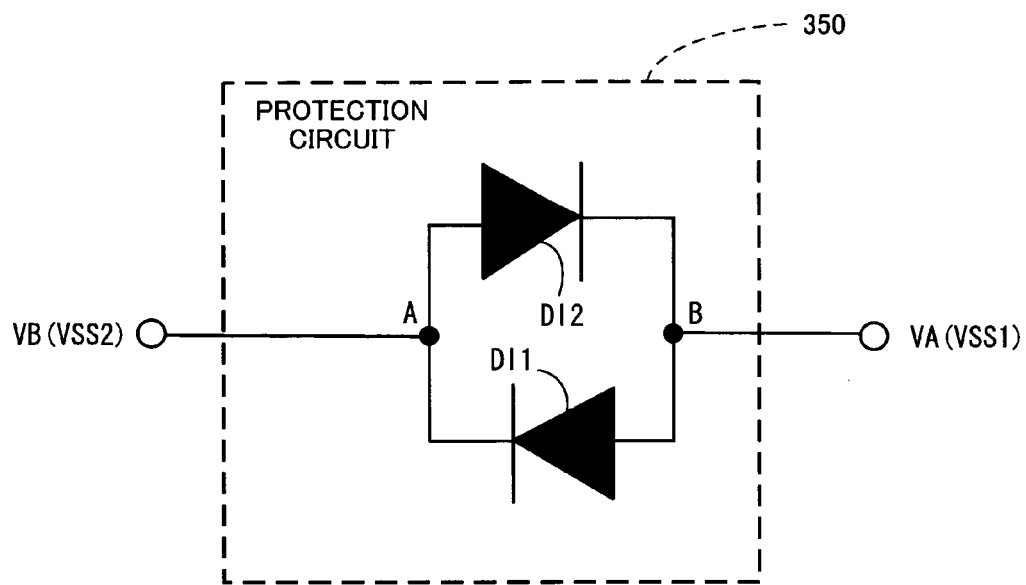
FIGS. 13A and 13B are views showing an example of the circuit configuration of an electrostatic discharge protection circuit (bidirectional diode) inserted between a first low-potential power supply and a second low-potential power supply.
Figure 13B:
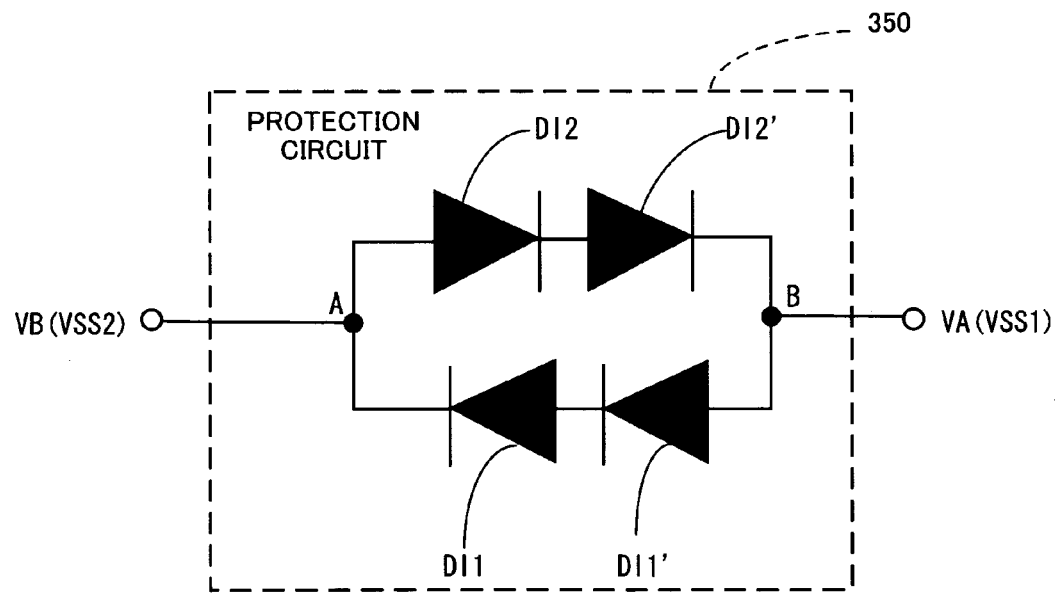

FIGS. 13A and 13B are views showing the circuit configuration of the electrostatic discharge protection circuit (bidirectional diode) inserted between the first low-potential power supply and the second low-potential power supply. A plurality of stages of diodes may be provided, as shown in FIG. 13B. The following description is given taking an example of providing one diode, as shown in FIG. 13A.

In FIG. 13, the potential at a point A (common connection point of the cathode of the diode DI1 and the anode of the diode DI2) is VB (=VSS2), and the potential at a point B (common connection point of the anode of the diode DI1 and the cathode of the diode DI2) is VA (=VSS1).

Figure 14:
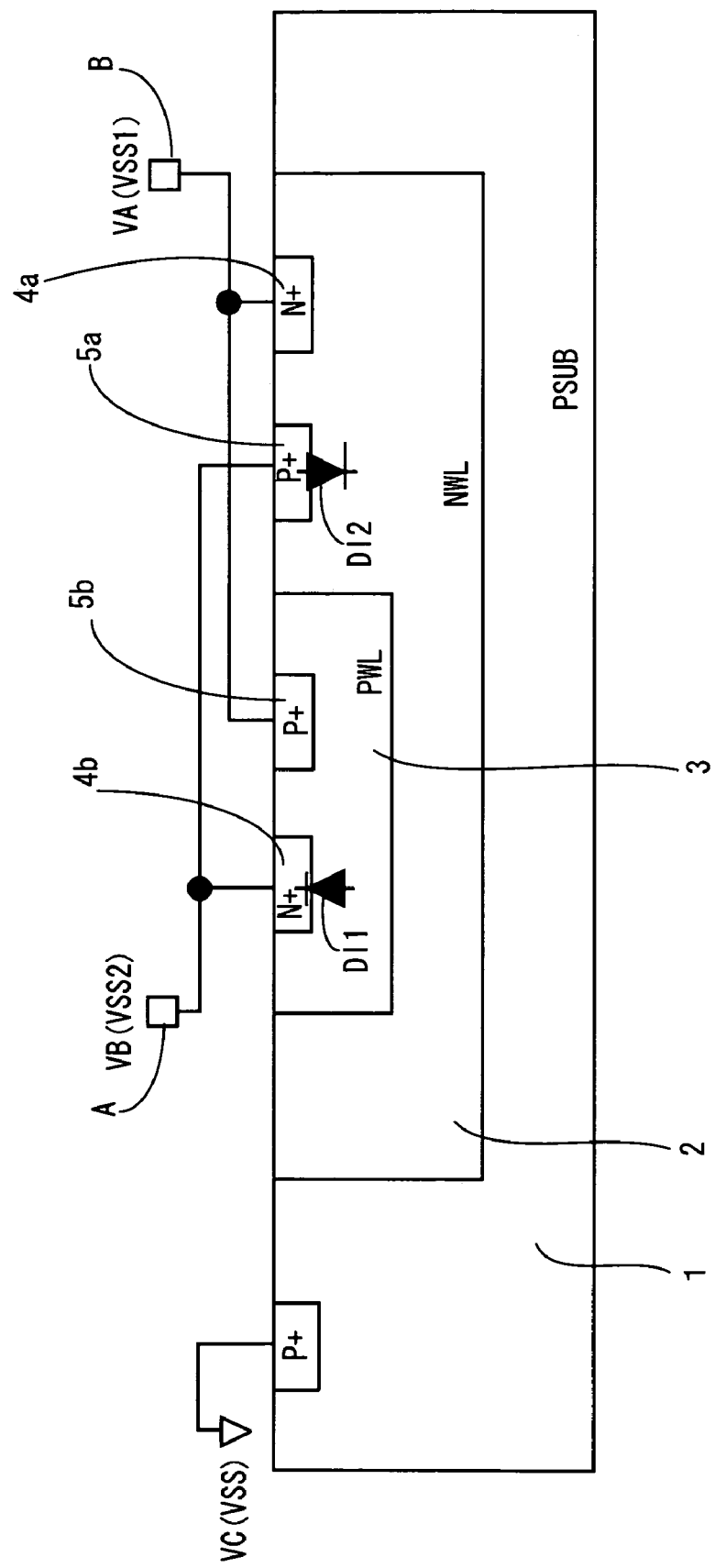
FIG. 14 is a cross-sectional view showing an example of the device structure of the electrostatic discharge protection circuit (bidirectional diode) shown in FIG. 13.

FIG. 14 is a cross-sectional view showing the device structure of the electrostatic discharge protection circuit (bidirectional diode) shown in FIG. 13 (FIG. 16A). As shown in FIG. 14, the first diode (first PN diode (PN diode)) DI1 is formed between a P-well 3 and an N+ region 4b. The second diode (PN diode) DI2 is formed between a P+ region 5a and an N-well 2.

Figure 15:
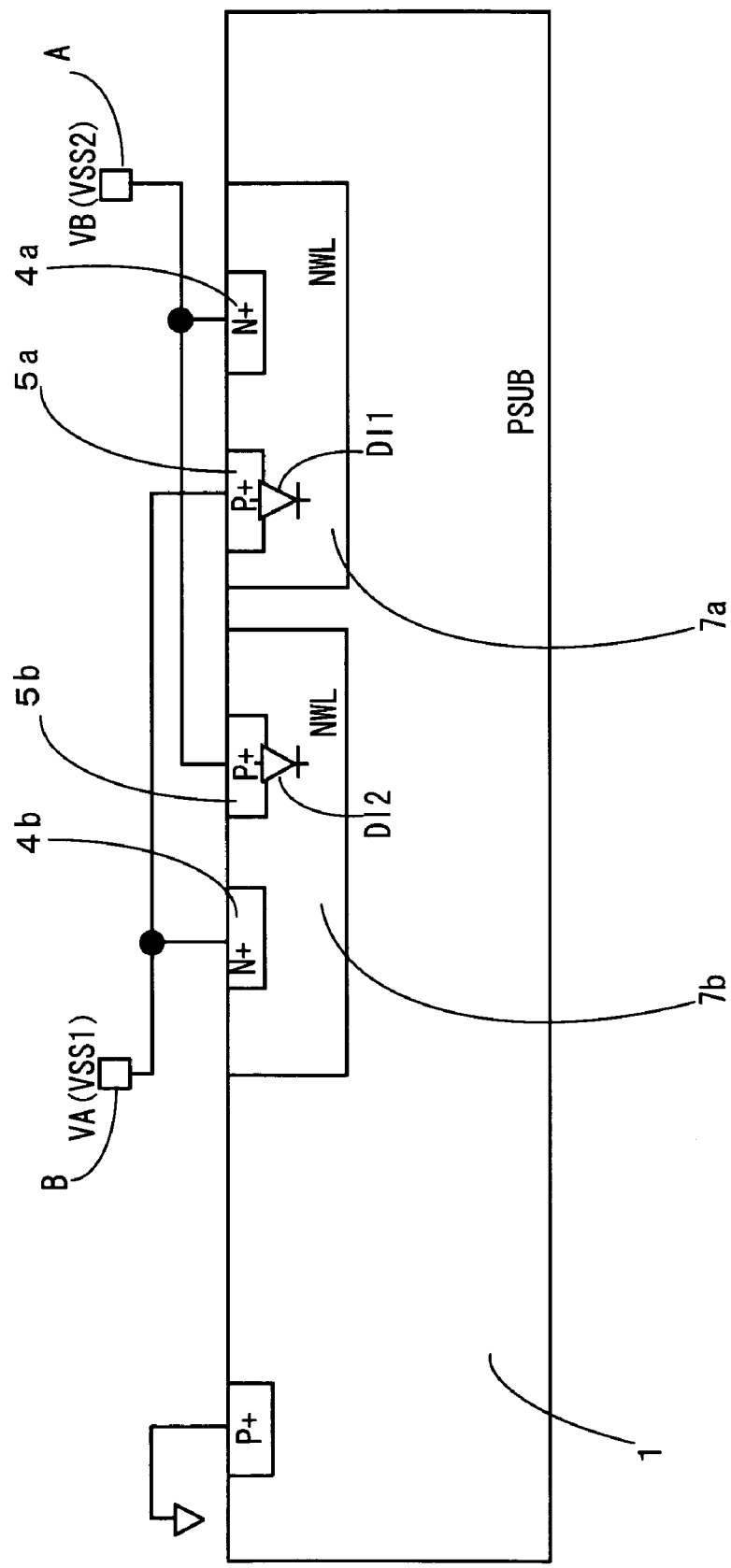
FIG. 15 is a cross-sectional view showing another example of the device structure of the electrostatic discharge protection circuit (bidirectional diode) shown in FIG. 13.

FIG. 15 is a cross-sectional view showing another example of the device structure of the electrostatic discharge protection circuit (bidirectional diode) shown in FIG. 13A. FIG. 15 employs a more simplified structure. Specifically, the first PN diode DI1 is formed at the junction between the P+ region 5a and an N-well (NWL) 7a. The second PN diode DI2 is formed at the junction between the P+ region 5b and an N-well (NWL) 7b. The structure shown in FIG. 18 has an advantage in that there is less load imposed on the production process.

Second Embodiment

This embodiment illustrates an example in which the invention is applied to a driver IC of a liquid crystal display device.

Entire Configuration of Liquid Crystal Display Device

Figure 16:
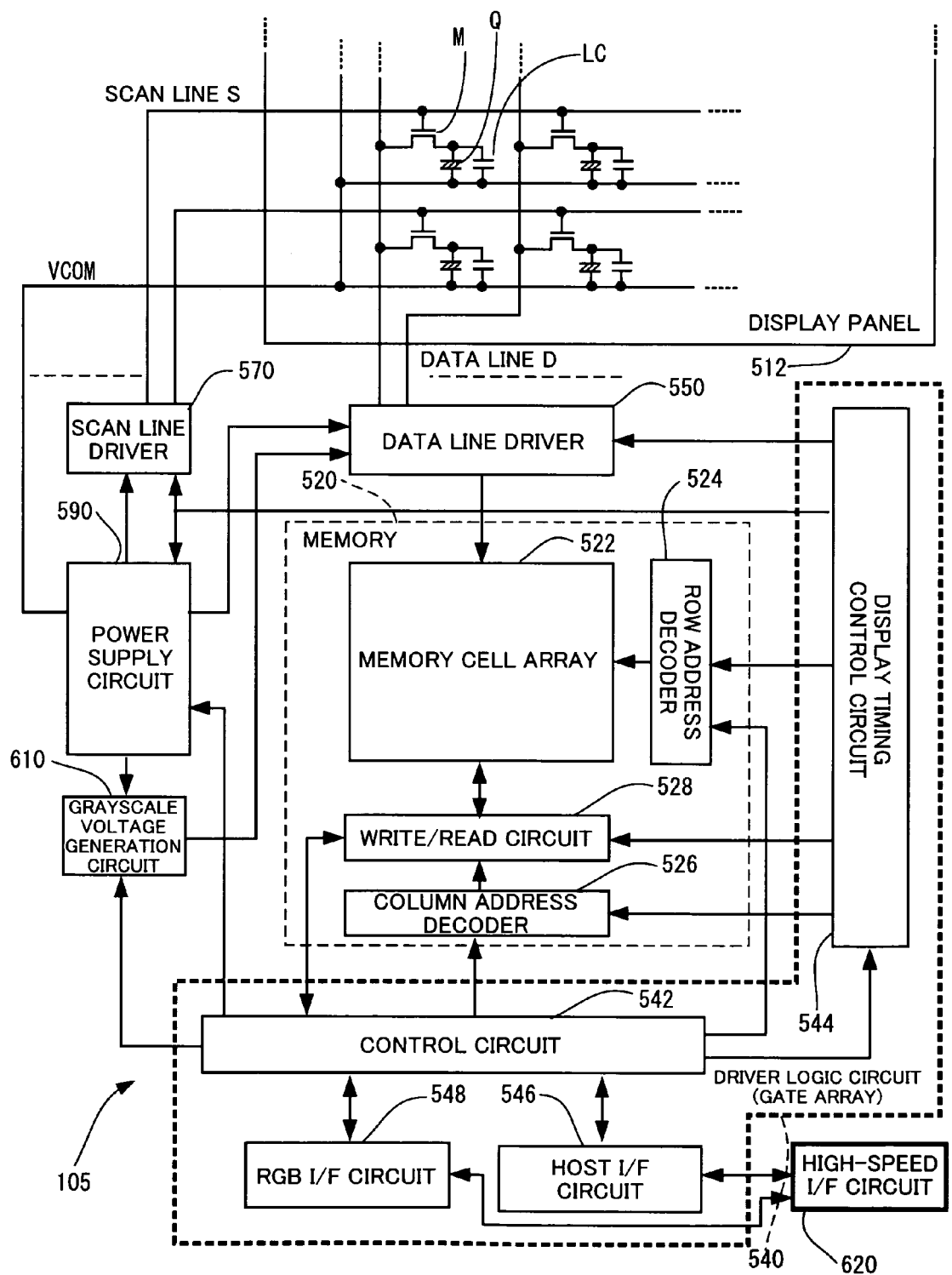
FIG. 16 is a block diagram showing the configuration of a driver IC (and part of a liquid crystal panel) of a liquid crystal display device to which the invention is applied.

FIG. 16 is a block diagram showing the configuration of a driver IC (and part of a liquid crystal panel) of a liquid crystal display device to which the invention is applied.

A display panel 512 includes a plurality of data lines (D), a plurality of scan lines (S), and a plurality of pixels specified by the data lines and the scan lines. A display operation is implemented by changing the optical properties of an electro-optical element (liquid crystal element in a narrow sense) in each pixel region. Each pixel includes a transfer switch (M), a storage capacitor (Q), and a liquid crystal element (LC).

The liquid crystal panel 512 is an active matrix type panel utilizing a switching element such as a TFT or a TFD. The liquid crystal panel 512 may be a panel other than an active matrix type panel, or may be a panel (e.g., organic EL panel) other than a liquid crystal panel.

In the driver IC (reference numeral 105) of the liquid crystal display device shown in FIG. 16, the technology according to the invention described with reference to the first embodiment is used for an interface section between a high-speed interface (high-speed I/F circuit) 620 and a driver logic circuit 540 (enclosed by a bold dotted line in FIG. 16).

The configuration of the driver IC (reference numeral 105) of the liquid crystal display device shown in FIG. 16 is described below.

A memory 520 (RAM) stores image data. A memory cell array 522 includes a plurality of memory cells, and stores image data (display data) corresponding to at least one frame (one screen). The memory 520 includes a row address decoder 524 (MPU/LCD row address decoder), a column address decoder 526 (MPU column address decoder), and a write/read circuit 528 (MPU write/read circuit).

A logic circuit 540 (driver logic circuit) generates a display control signal for controlling a display timing or a data processing timing. The logic circuit 540 may be formed by automatic placement and routing (e.g., gate array (G/A)), for example.

A control circuit 542 generates various control signals, and controls the entire device. A display timing control circuit 544 generates a control signal for controlling a display timing, and controls reading of the image data from the memory 520 into the liquid crystal panel 512.

A host interface (I/F) circuit 546 implements a host interface by generating an internal pulse and accessing the memory 520 each time access from a host (MPU) occurs. An RGB I/F circuit 548 implements an RGB interface by writing motion picture RGB data into the memory 520 based on a dot clock signal. The high-speed I/F circuit 620 implements high-speed serial transfer through a serial bus.

A data driver 550 generates a data signal for driving the data line of the liquid crystal panel 512. Specifically, the data driver 550 receives grayscale data (image data) from the memory 520, and receives a plurality of (e.g., 64) grayscale voltages (reference voltages) from a grayscale voltage generation circuit 610. The data driver 550 selects a voltage corresponding to the grayscale data from the received grayscale voltages, and outputs the selected voltage to each data line of the liquid crystal panel 512 as the data signal (data voltage).

A scan driver 570 generates a scan signal for driving the scan line of the liquid crystal panel. A power supply circuit 590 generates various power supply voltages, and supplies the power supply voltages to the data driver 550, the scan driver 570, the grayscale voltage generation circuit 610, and the like. The grayscale voltage generation circuit 610 (gamma correction circuit) generates the grayscale voltage, and outputs the grayscale voltage to the data driver 550.

Specific Configuration and Operation of High-Speed Interface (I/F) Circuit

Figure 17A:
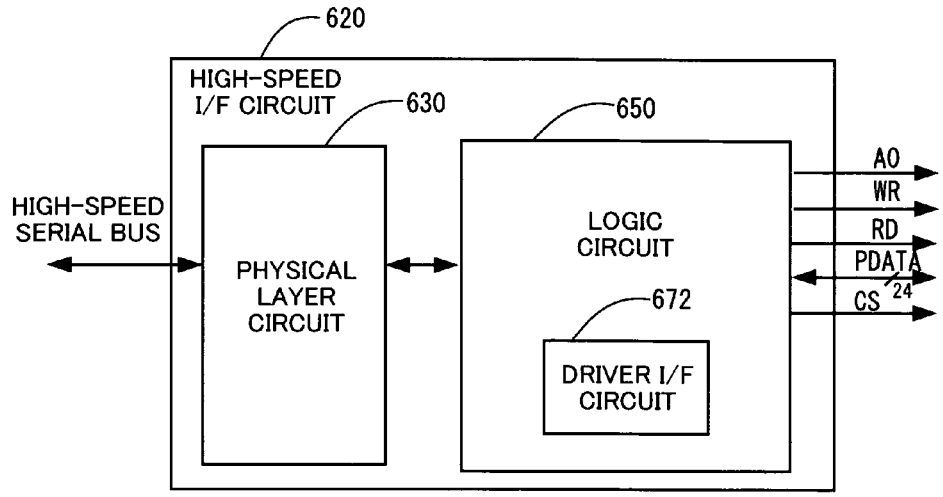
FIGS. 17A to 17C are views illustrative of a specific configuration and operation of a high-speed interface (I/F) circuit.
Figure 17B:
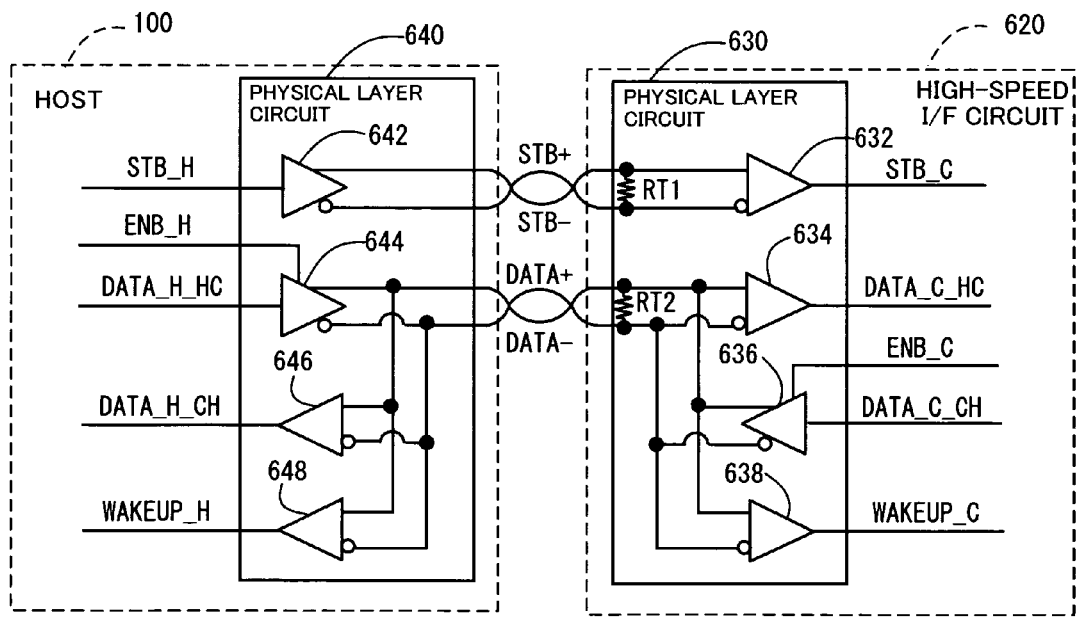
Figure 17C:
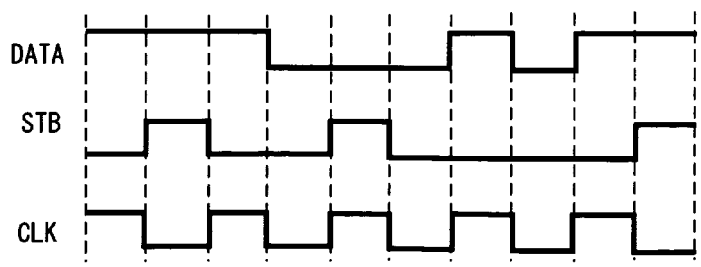

A specific configuration of the high-speed I/F circuit 620 is described below. FIGS. 17A to 17C are views illustrative of a specific configuration and operation of the high-speed interface (I/F) circuit.

FIG. 17A shows a configuration example of the high-speed I/F circuit 620. A physical layer circuit 630 (analog front-end circuit or transceiver) receives or transmits data (a packet) through a serial bus using differential signals (differential data signals, differential strobe signals, and differential clock signals) or the like. Specifically, the physical layer circuit 630 transmits or receives data by current-driving or voltage-driving differential signal lines of the serial bus. The physical layer circuit 630 may include at least one of a receiver circuit which receives data through the serial bus and a transmitter circuit which transmits data through the serial bus.

The serial bus may have a multi-channel configuration. A serial transfer may be performed by single-end transfer. The physical layer circuit 630 may include a high-speed logic circuit. The high-speed logic circuit operates based on a high-speed clock signal corresponding to a serial bus transfer clock signal. Specifically, the physical layer circuit 630 may include a serial/parallel conversion circuit which converts serial data received through the serial bus into parallel data, a parallel/serial conversion circuit which converts parallel data into serial data transmitted through the serial bus, a FIFO, an elasticity buffer, a frequency divider circuit, and the like.

A logic circuit 650 is a logic circuit included in the high-speed I/F circuit 620, and performs a process of a link layer or a transaction layer higher than the physical layer. For example, the logic circuit 650 analyzes a packet received by the physical layer circuit 630 through the serial bus, separates the header and data of the packet, and extracts the header. When transmitting a packet through the serial bus, the logic circuit 650 generates the packet. The logic circuit 650 may be formed by automatic placement and routing (e.g., gate array (G/A)), for example.

The logic circuit 650 includes a driver I/F circuit 672. The driver I/F circuit 672 performs an interface process between the high-speed I/F circuit 620 and an internal circuit (driver logic circuit 540 and host I/F circuit 546 in FIG. 7) of a display driver. Specifically, the driver I/F circuit 672 generates interface signals including an address 0 signal A0 (command/data identification signal), a write signal WR, a read signal RD, a parallel data signal PDATA, a chip select signal CS, and the like, and outputs the interface signals to the internal circuits (other circuit blocks) of the display driver.

FIG. 17B shows a configuration example of the physical layer circuit. In FIG. 11B, a physical layer circuit 640 is provided in a host device, and the physical layer circuit 630 is provided in the display driver. Reference numerals 636, 642, and 644 indicate transmitter circuits, and reference numerals 632, 634, and 646 indicate receiver circuits. Reference numerals 638 and 648 indicate wakeup detection circuits. The host-side transmitter circuit 642 drives signals STB+/−.

The client-side receiver circuit 632 amplifies a voltage across a resistor RT1 generated by driving the signals STB+/−, and outputs a strobe signal STB_C to the circuit in the subsequent stage. The host-side transmitter circuit 644 drives signals DATA+/−. The client-side receiver circuit 634 amplifies a voltage across a resistor RT2 generated by driving the data signals DATA+/−, and outputs a data signal DATA_C_HC to the circuit in the subsequent stage.

As shown in FIG. 17C, the transmitter side generates a strobe signal STB by calculating the exclusive OR of a data signal DATA and a clock signal CLK, and transmits the strobe signal STB to the receiver side through a high-speed serial bus. The receiver side calculates the exclusive OR of the data signal DATA and the strobe signal STB to reproduce the clock signal CLK.

Figure 18A:
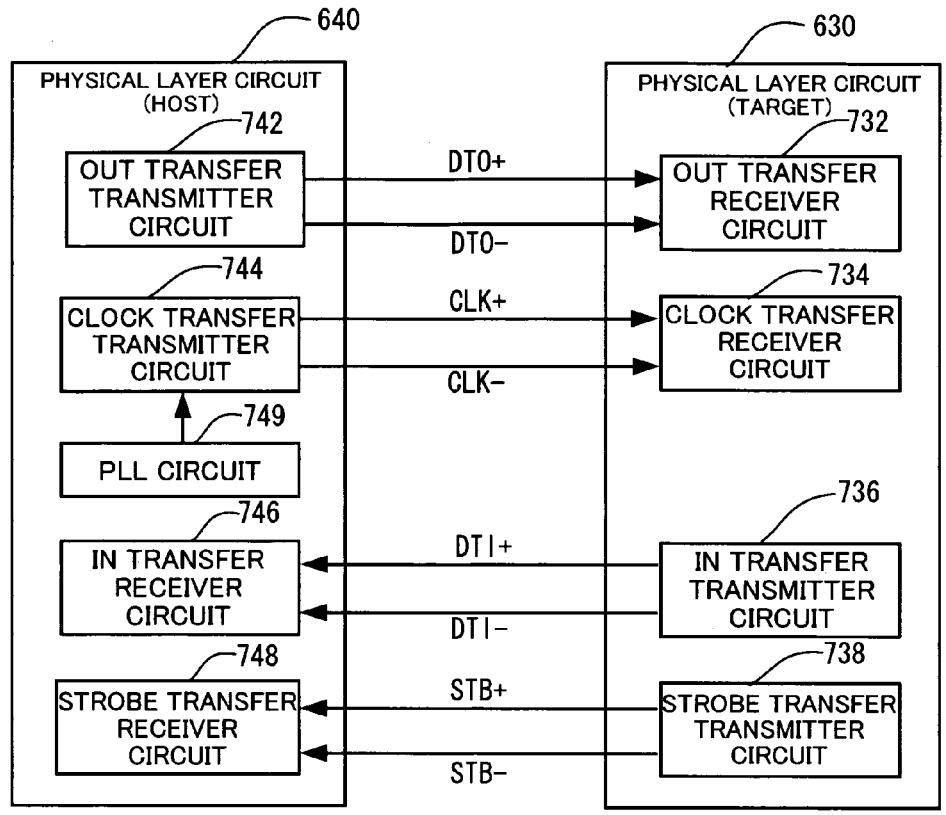
FIGS. 18A and 18B are circuit diagrams showing modifications of the configuration of a physical layer included in a high speed interface (I/F) circuit.
Figure 18B:
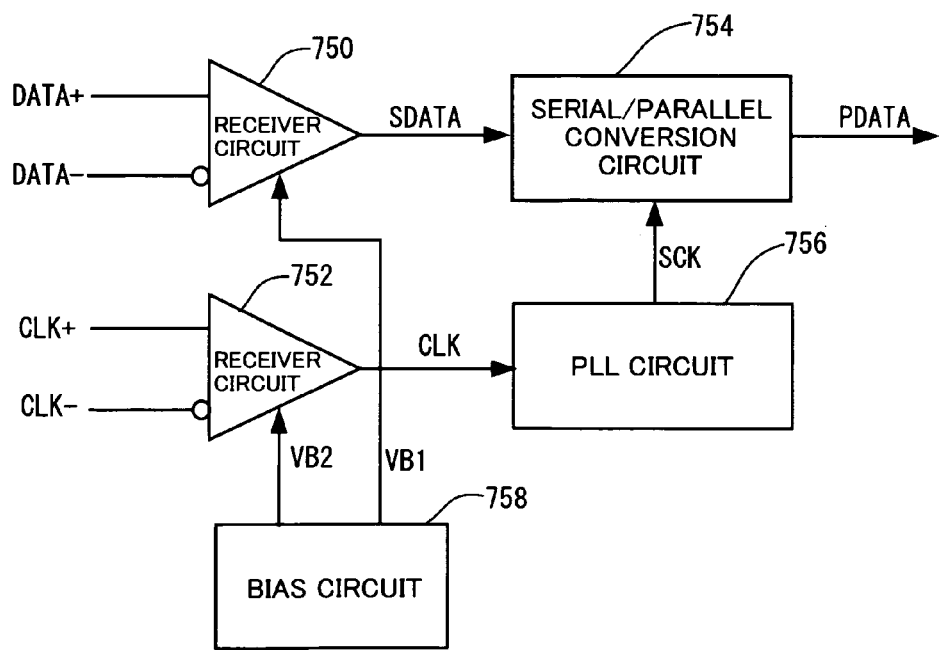

The configuration of the physical layer circuit is not limited to the configuration shown in FIG. 17B. Various modifications and variations may be made such as those shown in FIGS. 18A and 18B. FIGS. 18A and 18B are circuit diagrams showing modifications of the configuration of the physical layer included in the high-speed interface (I/F) circuit.

In a first modification shown in FIG. 18A, the host outputs differential data signals (OUT data) DTO+/− in synchronization with the edge of clock signals CLK+/−. Therefore, the target can sample and hold the data signals DTO+/− using the clock signals CLK+/−. The target generates and outputs differential strobe signals STB+/− based on the differential clock signals CLK+/− supplied from the host. The target outputs differential data signals (IN data) DTI+/− in synchronization with the edge of the strobe signals STB+/−. Therefore, the host can sample and hold the data signals DTI+/− using the strobe signals STB+/−.

In a second modification shown in FIG. 18B, a data receiver circuit 750 receives the differential data signals DATA+/−, and outputs serial data SDATA to a serial/parallel conversion circuit 754. A clock signal receiver circuit 752 receives the differential clock signals CLK+/−, and outputs the clock signal CLK to a phase locked loop (PLL) circuit 756 in the subsequent stage. The PLL circuit 756 generates a sampling clock signal SCK (multi-phase sampling clock signals at the same frequency but with different phases) based on the clock signal CLK, and outputs the sampling clock signal SCK to the serial/parallel conversion circuit 754. The serial/parallel conversion circuit 754 samples the serial data SDATA using the sampling clock signal SCK, and outputs parallel data PDATA.

In a portable telephone, for example, a host device (e.g., MPU, BBE/APP, or image processing controller) is mounted on a first circuit board in a first instrument section of the portable telephone in which buttons for inputting a telephone number or a character are provided. A display driver is mounted on a second circuit board in a second instrument section of the portable telephone in which a liquid crystal panel (LCD) or a camera device is provided.

According to related-art technology, data is transferred between the host device and the display driver by a CMOS voltage level parallel transfer. Therefore, the number of interconnects passing through a connection section (e.g., hinge) which connects the first and second instrument sections increases, whereby the degree of freedom relating to the design may be impaired, or EMI noise may occur.

According to the high-speed interface circuit shown in FIGS. 17 and 18, data is transferred between the host device and the display driver by a small-amplitude serial transfer. Therefore, the number of interconnects passing through the connection section which connects the first and second instrument sections can be reduced while reducing EMI noise.

Layout Example of Liquid Crystal Display Device Driver IC

Figure 19:
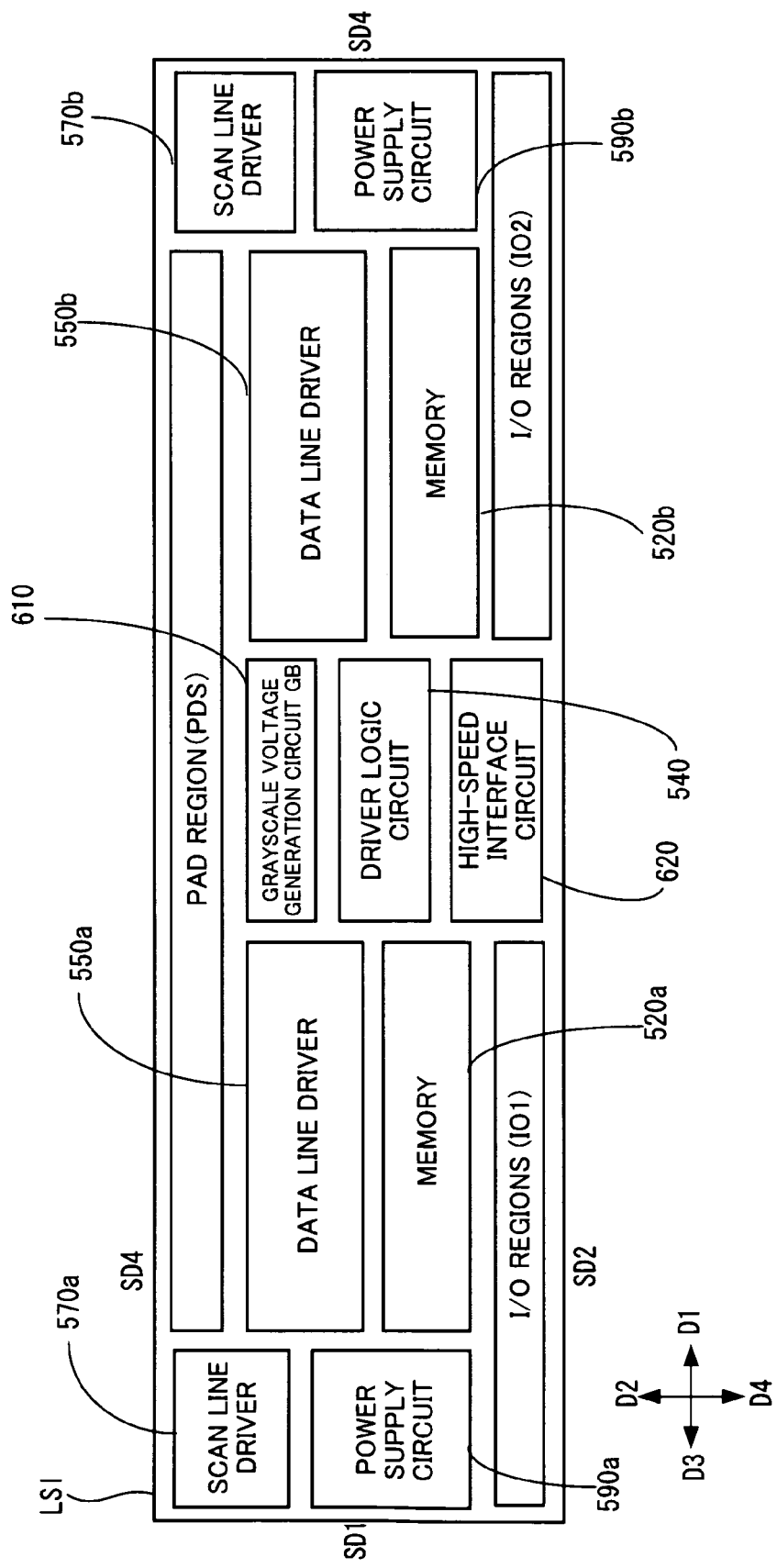
FIG. 19 is a view showing a layout example of a liquid crystal display device driver IC.

FIG. 19 is a view showing a layout example of the liquid crystal display device driver IC 105. As shown in FIG. 19, the high-speed I/F circuit 620, the driver logic circuit 540, and the grayscale voltage generation circuit 610 are disposed at the center. Data line drivers 550a and 550b, memories 520a and 520b, scan line drivers 570a and 570b, and power supply circuits 590a and 590b are symmetrically disposed in order. In FIG. 19, I/O regions (101 and 102) are pad regions which receive input signals. A pad region (PDS) is a region in which output pads are disposed in a row.

Type of Circuit Used for IC

Figure 20:
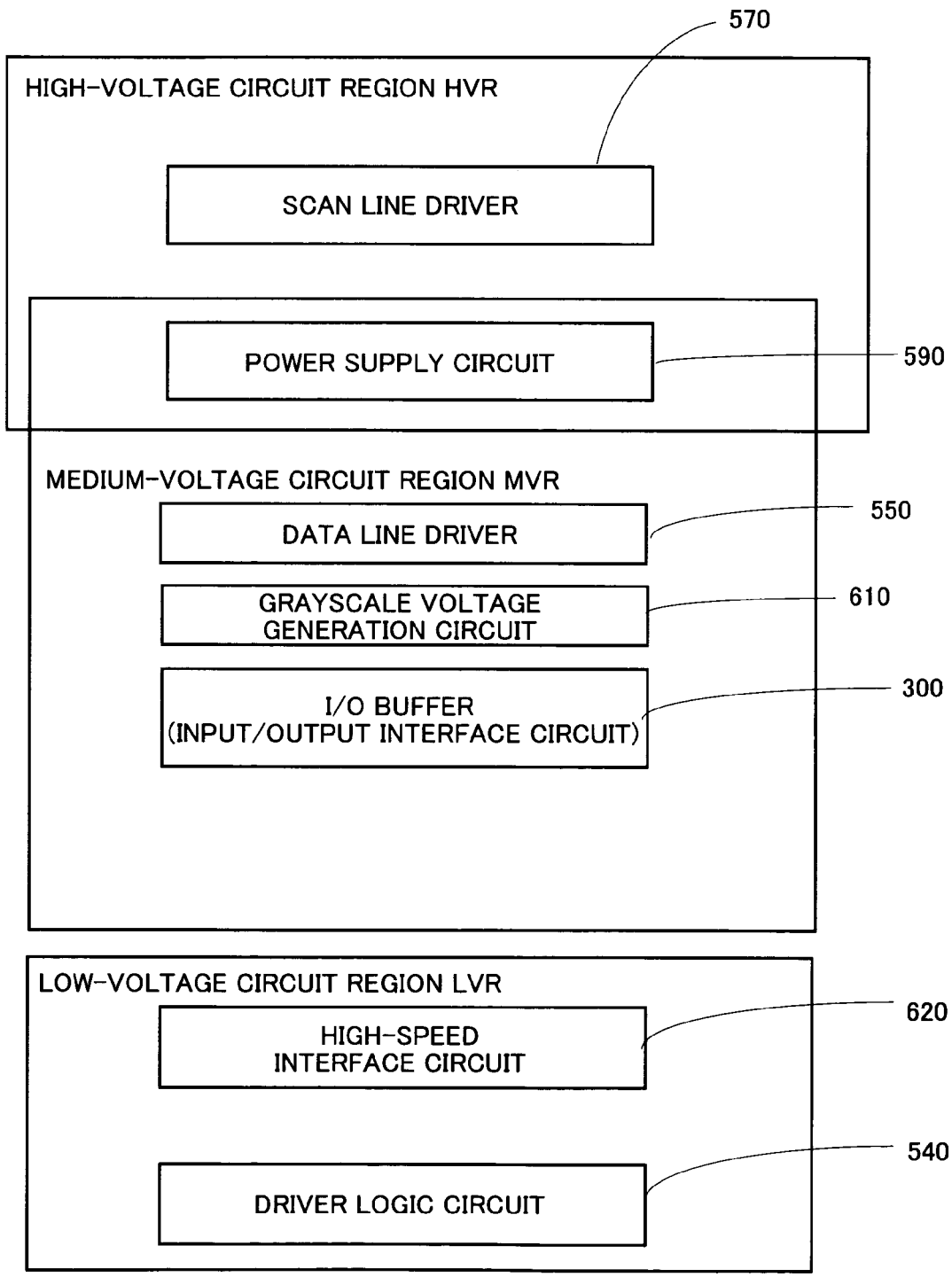
FIG. 20 is a view showing the type of circuit (classification depending on breakdown voltage) used in a liquid crystal display device driver IC.

FIG. 20 is a view showing the type of circuit (classification depending on the breakdown voltage) used in the liquid crystal display device driver IC. As shown in FIG. 20, a low-voltage circuit region (LVR), a medium-voltage circuit region (MVR) of which the breakdown voltage is higher than that of the low-voltage circuit region LV, and a high-voltage circuit region (MVR) of which the breakdown voltage is higher than that of the medium-voltage circuit region MV are provided.

The high-speed I/F circuit block 620, the I/O buffer (interface circuit) 300, and the driver logic circuit 540 are provided in the low-voltage circuit region (LVR). Part of the power supply circuit 590, the data line driver 550, and the grayscale voltage generation circuit 610 are formed in the medium-voltage circuit region (MVR). The scan line driver 570 and part of the power supply circuit 590 are provided in the high-voltage circuit region (HVR).

Device Structure (Triple-Well Structure) of First Circuit Block and Second Circuit Block The integrated circuit device (IC) 105 according to the invention employs a triple-well structure, for example. The triple-well structure is employed on the assumption that the first circuit block and the second circuit block operate using different power supply systems.

Circuits which operate using different power supply systems can be reasonably formed in a compact manner using the triple-well structure. According to the triple-well structure, the transistors of the first circuit block and the transistors of the second circuit block can be electrically separated by a barrier (diode) formed between a second-conductivity-type substrate (e.g., PSUB) and a first first-conductivity-type well (e.g., NWL(1)). This makes it possible to adjacently provide the first circuit block and the second circuit block while electrically separating the first circuit block and the second circuit block.

Figure 21A:
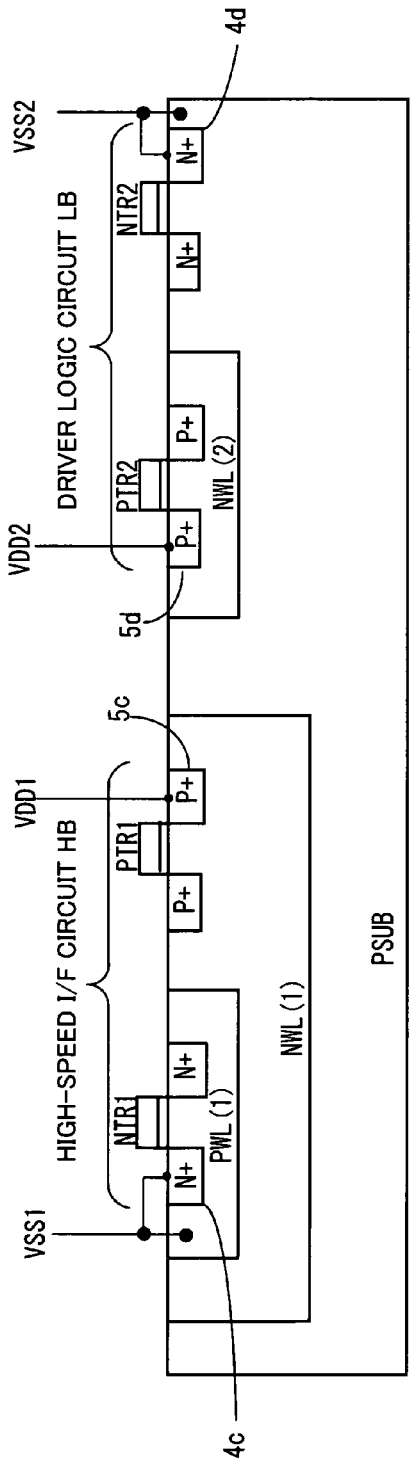
FIGS. 21A and 21B are cross-sectional views showing the device structure (triple-well structure) of a first circuit block and a second circuit block.
Figure 21B:
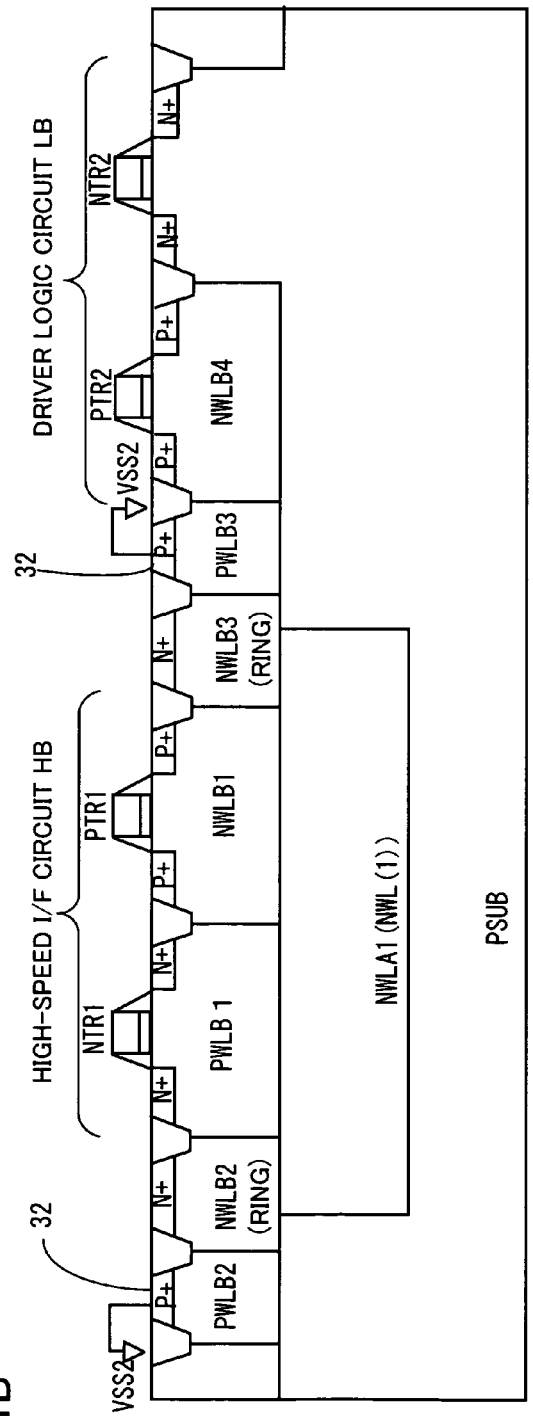

The device structure is described below with reference to the drawings. FIGS. 21A and 21B are cross-sectional views showing the device structure (triple-well structure) of the first circuit block and the second circuit block.

As shown in FIG. 21A, an N-type transistor NTR1 (first-conductivity-type transistor in a broad sense) included in a high-speed I/F circuit block HB is formed in a P-type well (second-conductivity-type well in a broad sense) PWL(1). A P-type transistor (second-conductivity-type transistor in a broad sense) PTR1 included in the high-speed I/F circuit block HB is formed in an N-type well NWL(1) formed in a P-type substrate PSUB to enclose the P-type well PWL(1).

An N-type transistor NTR2 and a P-type transistor PTR2 included in a driver logic circuit block LB (driver circuit) are not formed in the N-type well NWL(1) for the high-speed I/F circuit block HB, but are formed in a region other than the N-type well NWL(1). Specifically, the P-type transistor PTR2 is formed in an N-type well NWL(2) separated from the N-type well NWL(1) for the high-speed I/F circuit block HB, and the N-type transistor NTR2 is formed in the P-type substrate PSUB. This enables the transistors NTR1 and PTR1 which form the high-speed I/F circuit block HB to be separated from the transistors NTR2 and PTR2 which form the driver logic circuit block LB using the N-type well NWL(1) which has a triple-well structure. Therefore, transmission of noise between the high-speed I/F circuit block HB and the driver logic circuit block LB can be prevented using the N-type well NWL(1) as a barrier. Therefore, the high-speed I/F circuit block HB (physical layer circuit PHY) is rarely adversely affected by noise produced by the driver logic circuit block LB, whereby serial transfer quality can be maintained. Moreover, the driver logic circuit block LB and the like are rarely adversely affected by noise produced by the high-speed I/F circuit block HB, whereby malfunction and the like can be prevented. Note that the transistors NTR2 and PTR2 of the driver logic circuit block LB may be formed using a triple-well structure.

FIG. 21B shows a detailed example of the triple-well structure. N-type wells NWLA1, NWLB1, NWLB2, and NWLB3 shown in FIG. 21B correspond to the N-type well NWL(1) shown in FIG. 21A. A P-type well PWLB1 shown in FIG. 21B corresponds to the P-type well PWL(1) shown in FIG. 18A. A N-type well NWLB4 shown in FIG. 21B corresponds to the N-type well NWL(2) shown in FIG. 21A.

In FIG. 21B, the N-type well NWLA1 is a deep well, and the N-type wells NWLB1, NWLB2, NWLB3, and NWLB4 are shallow wells. The N-type wells NWLB2 and NWLB3 are formed in the shape of rings. Therefore, the N-type well can be formed to enclose the P-type well PWLB1. A P+ region (second-conductivity-type diffusion region in a broad sense) electrically connected to a VSS power supply line is formed in the P-type wells PWLB2 and PWLB3. The potential of the P-type substrate PSUB can be stabilized by providing the P-type wells PWLB2 and PWLB3 and a P+ region 32, whereby noise tolerance can be increased.

The substrate potential stabilization P+ region (second-conductivity-type diffusion region) may be formed using a method described with reference to FIG. 22A or 22B, for example.

Figure 22A:
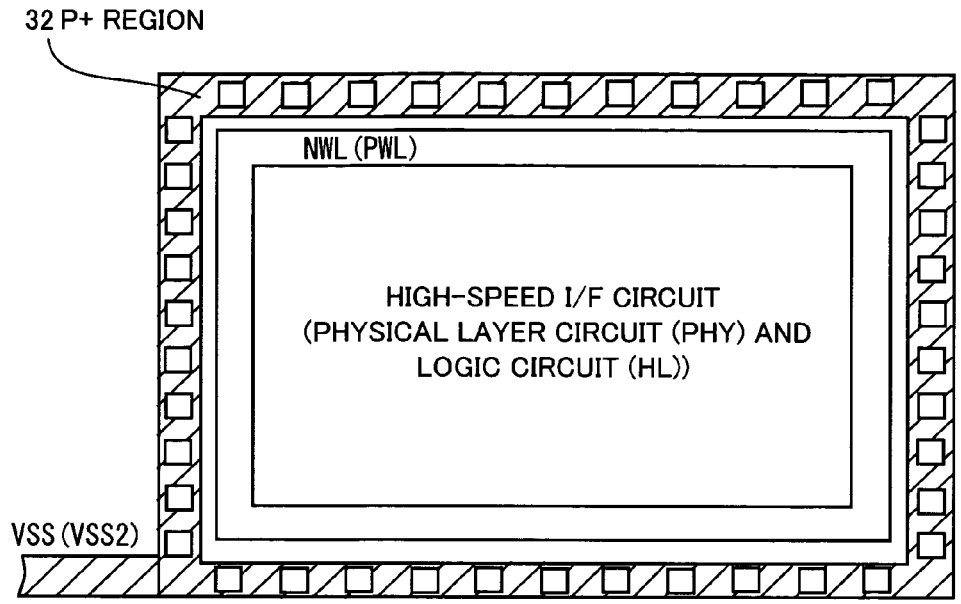
FIGS. 22A and 22B are views showing a method of forming a substrate potential stabilization P+ region (second-conductivity-type diffusion region).

In FIG. 22A, the substrate potential stabilization P+ region electrically connected to the power supply VSS of the driver logic circuit block LB is formed in the P-type substrate PSUB in the shape of a ring to enclose the high-speed I/F circuit block HB. Specifically, a guard ring formed of the P+ region 32 electrically connected to the VSS power supply line through a contact is provided to enclose the N-type well NWL(1) in which the high-speed I/F circuit block HB is formed. Therefore, the potential of the P-type substrate PSUB on the periphery of the N-type well NWL(1) is stabilized, whereby a situation in which noise produced by the high-speed I/F circuit block HB is transmitted to the driver logic circuit block LB and the like can be effectively prevented.

Figure 22B:
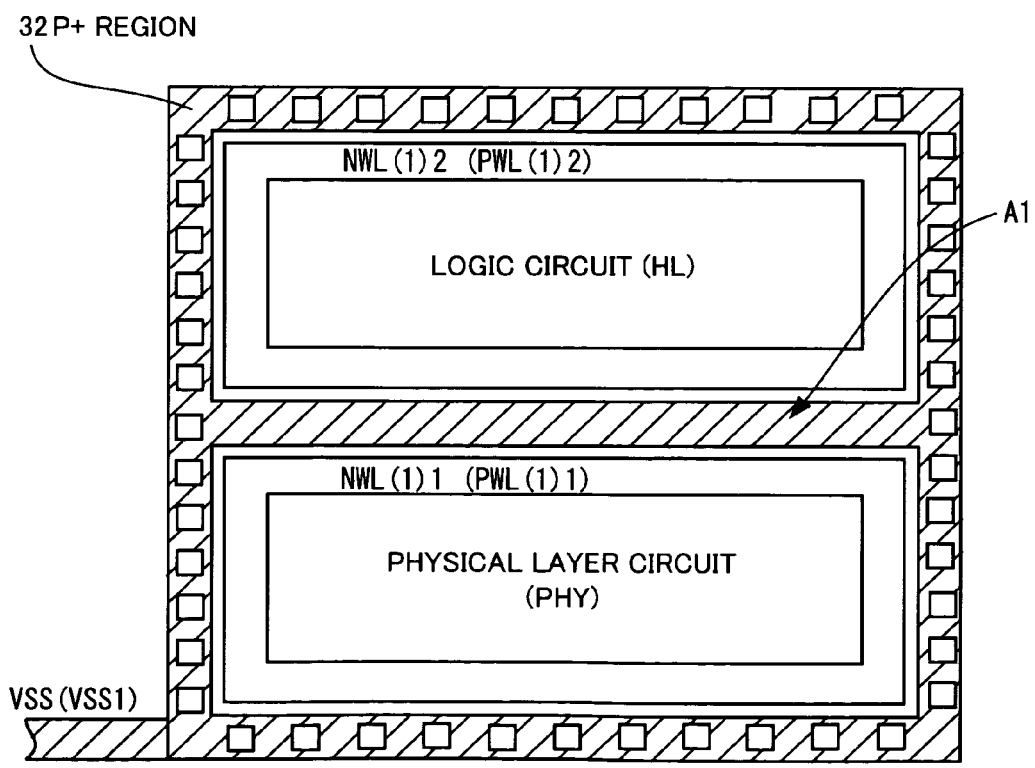

In FIG. 22B, the physical layer circuit PHY included in the high-speed I/F circuit block HB is formed in an N-type well NWL(1)1 having a triple-well structure, and the logic circuit HL is formed in an N-type well NWL(1)2 having a triple-well structure formed separately from the N-type well NWL(1)1. Specifically, an N-type transistor which forms the physical layer circuit PHY is formed in the P-type well PWL(1)1. A P-type transistor which forms the physical layer circuit PHY is formed in an N-type well NWL(1)1 formed in the P-type substrate PSUB to enclose the P-type well PWL(1)1.

An N-type transistor which forms the logic circuit HL is formed in a P-type well PWL(1)2. A P-type transistor which forms the logic circuit HL is formed in the N-type well NWL(1)2 formed in the P-type substrate PSUB to enclose the P-type well PWL(1)2.

In FIG. 22B, the physical layer circuit PHY and the logic circuit HL are formed in different wells of the triple-well structure. Therefore, the physical layer circuit PHY is rarely adversely affected by noise produced by the logic circuit HL, whereby serial transfer quality can be maintained. Moreover, the logic circuit HL is rarely adversely affected by noise produced by the physical layer circuit PHY, whereby malfunction and the like can be prevented. The N-type well NWL(1)2 in which the logic circuit HL is formed serves as a barrier to reduce transmission of noise between the physical layer circuit PHY and the driver logic circuit block LB.

In FIG. 22B, the VSS power supply line is provided in the high-speed I/F circuit block HB. Specifically, the VSS power supply line is provided on the periphery and the inside of the high-speed I/F circuit block HB, as indicated by A1 in FIG. 22B. The P+ region connected to the VSS power supply line thus provided is formed in the P-type substrate PSUB between the N-type well NWL(1)1 and the N-type well NWL(1)2.

Therefore, the potential of the P-type substrate PSUB positioned between the N-type well NWL(1)1 and the N-type well NWL(1)2 is stabilized by the P+ region formed between the N-type well NWL(1)1 and the N-type well NWL(1)2. As a result, noise produced by the logic circuit HL is rarely transmitted to the physical layer circuit PHY, and noise produced by the physical layer circuit PHY is rarely transmitted to the logic circuit HL. Moreover, a protection circuit between power supplies VSSM and VSSG of the high-speed I/F circuit block HB and the power supply VSS can be efficiently arranged by providing the power supply line VSS as described above, whereby the layout efficiency and reliability can be improved.

The method of forming the N-type well and the P+ region in the high-speed I/F circuit block HB is not limited to the methods shown in FIGS. 22A and 22B. For example, the N-type well in which the analog circuit of the physical layer circuit PHY is formed may be separated from the N-type well in which the high-speed logic circuit of the physical layer circuit PHY is formed. This further improves noise tolerance.

Third Embodiment

Figure 23:
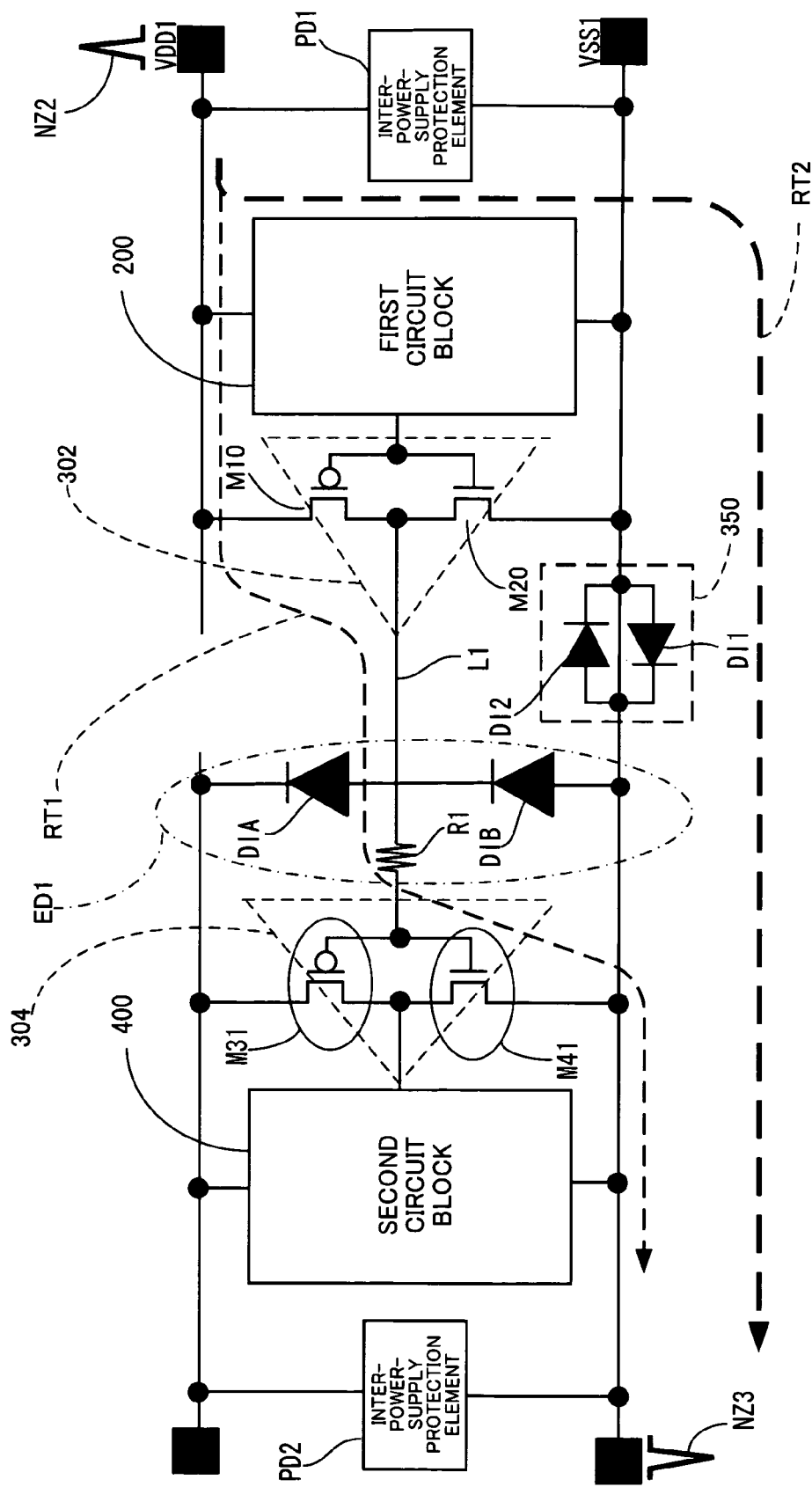
FIG. 23 is a circuit diagram showing an application example of an integrated circuit device according to the invention.

FIG. 23 is a circuit diagram showing an application example of the integrated circuit device according to the invention. The circuit configuration shown in FIG. 23 is the same as the circuit configuration shown in FIG. 6. In FIG. 23, the transistors which form the output buffer 304 (transistors of which the gate insulating film tends to break) are formed of medium-voltage transistors (M31 and M41) instead of low-voltage transistors.

Figure 24:
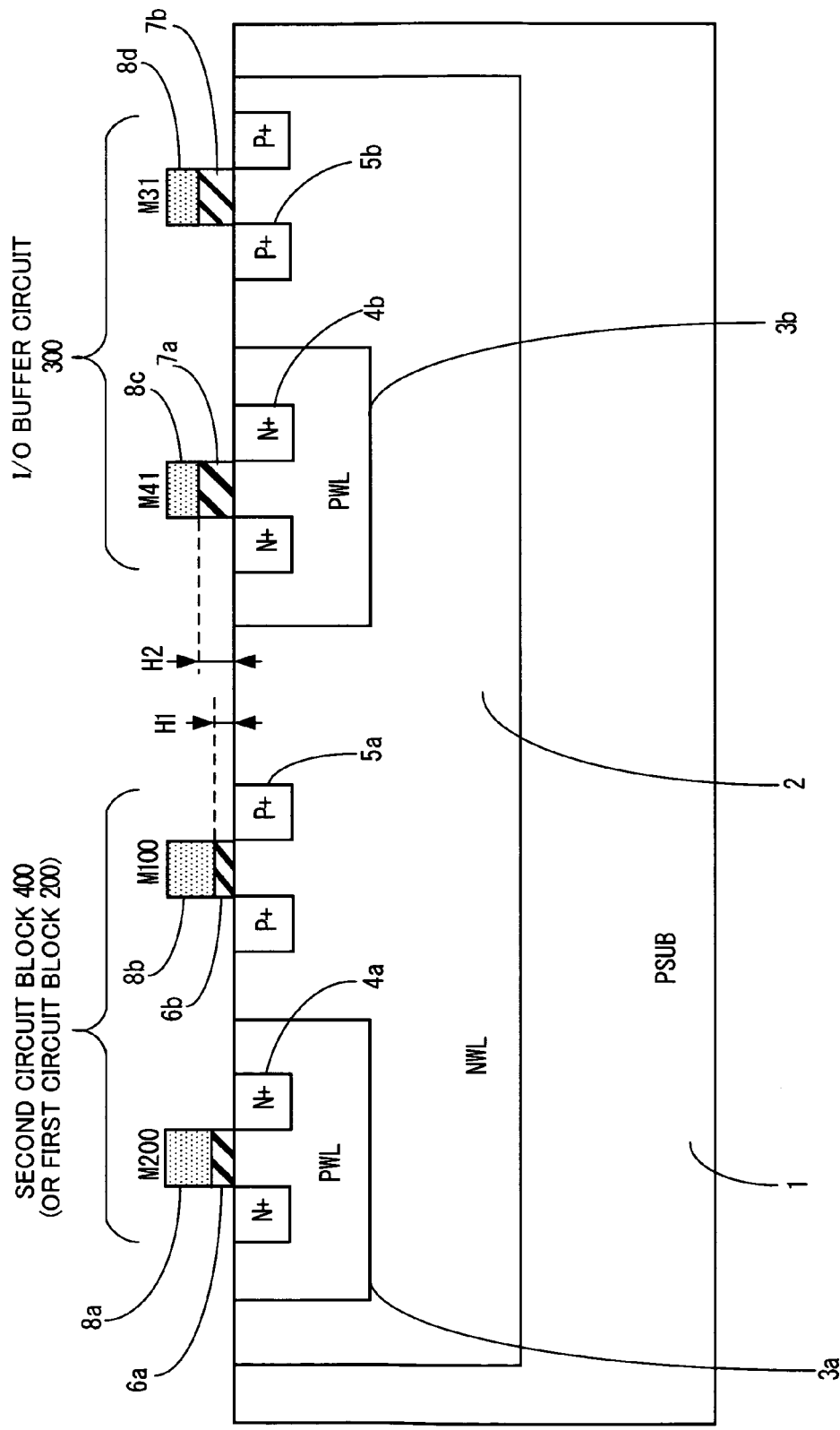
FIG. 24 is a device cross-sectional view showing the main portion of a circuit shown in FIG. 23.

FIG. 24 is a cross-sectional view showing the main portion of the device shown in FIG. 23. As shown in FIG. 24, the thickness (H2) of the gate insulating films of the transistors (M31 and M41) which form the input buffer 304 is set to be larger than the thickness (H1) of the gate insulating film of at least one transistor (M100 and M200) which forms the first circuit block or the second circuit block (200 or 400). At least one transistor (M100 and M200) which forms the first circuit block or the second circuit block (200 or 400) is a low-voltage transistor, for example.

The thickness H1 is about 50 angstroms, and the thickness H2 is about 150 angstroms, for example. Therefore, the transistors (M31 and M41) have an electrostatic breakdown voltage equal to or higher than a value twice the electrostatic breakdown voltage of the low-voltage transistor. Specifically, low-voltage transistors are generally used as the transistors (M31 and M41), giving priority to an increase in circuit operating speed. In this embodiment, the thickness of at least the transistors which form the input buffer (reference numerals 304 and 308 in FIG. 1) is increased, giving priority to prevention of electrostatic discharge destruction in a special mode.

The thickness (H2) of the gate insulating films of all of the insulated gate transistors included in the interface circuit (I/O buffer) 300 may be set to be larger than the thickness (H1) of the gate insulating film of at least one transistor (M100 and M200) which forms the first circuit block or the second circuit block (200 or 400).

In the liquid crystal driver IC shown in FIG. 16, medium-voltage (or high-voltage) transistors are used in addition to low-voltage transistors, as shown in FIG. 20. Therefore, transistors with an increased gate thickness can be reasonably formed by merely changing a mask.

Moreover, electrostatic discharge protection of transistors can be improved without adding a novel configuration by forming the gate insulating films of the transistor of the input buffers 304 and 308 to have a thickness larger than the thickness of the gate insulating films of all (or part) of the transistors which form the first circuit block or the second circuit block.

As described above, reliable electrostatic discharge protection can be achieved by providing the electrostatic discharge protection circuit (including the PN diodes and the diffused resistor) while reasonably improving electrostatic discharge protection by increasing the thickness of the gate insulating film of the transistor susceptible to electrostatic discharge destruction. When the IC includes transistors which differ in breakdown voltage, as shown in FIG. 20, low-voltage (LV) transistors can be easily replaced by medium-voltage (MV) transistors by merely changing a mask during production.

Although the embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

Any term cited with a different term having a broader meaning or the same meaning at least once in the specification and the drawings can be replaced by the different term in any place in the specification and the drawings. The configurations and the operations of the circuit and the electronic instrument are not limited to those described with reference to the above embodiments. Various modifications and variations may be made.

According to several embodiments of the invention, electrostatic discharge protection (electrostatic discharge resistance) of an integrated circuit device including an interface circuit provided between circuits (low-voltage circuits) that differ in power supply system can be reasonably and effectively improved without increasing the area of the integrated circuit device by forming an electrostatic discharge protection circuit in the interface circuit utilizing the remaining basic cells of a gate array or the like. Therefore, the reliability of the IC can be effectively improved.

The invention may be applied to a driver IC of a liquid crystal display device, for example.

What is claimed is:
1. An integrated circuit device comprising:
a first circuit block;
a second circuit block that operates using a power supply system differing from that of the first circuit block; and
an interface circuit provided between the first circuit block and the second circuit block,
the first circuit block operating using a first high-potential power supply and a first low-potential power supply;
the second circuit block operating using a second high-potential power supply and a second low-potential power supply;
the interface circuit including at least either a first buffer circuit or a second buffer circuit;
the first buffer circuit including:
a first output buffer that buffers a signal from the first circuit block and outputs the buffered signal to a first signal path, the first output buffer operating using the first high-potential power supply and the first low-potential power supply;
a first input buffer that buffers a signal transmitted from the first output buffer through the first signal path and supplies the buffered signal to the second circuit block, the first input buffer operating using the second high-potential power supply and the second low-potential power supply;

a first PN diode provided between the first signal path and the second high-potential power supply;

a second PN diode provided between the first signal path and the second low-potential power supply; and a first electrostatic discharge protection resistor that is provided in the first signal path and formed by an impurity region; and the second buffer circuit including:

a second output buffer that buffers a signal from the second circuit block and outputs the buffered signal to a second signal path, the second output buffer operating using the second high-potential power supply and the second low-potential power supply;

a second input buffer that buffers a signal transmitted from the second output buffer through the second signal path and supplies the buffered signal to the first circuit block, the second input buffer operating using the first high-potential power supply and the first low-potential power supply;

a third PN diode provided between the second signal path and the first high-potential power supply;

a fourth PN diode provided between the second signal path and the first low-potential power supply; and a second electrostatic discharge protection resistor that is provided in the second signal path and formed by an impurity region, the second circuit block being a circuit block that includes a circuit formed by connecting a plurality of basic cells through wires;

each of the plurality of basic cells including circuit elements that include at least:

a first-conductivity-type well region;

a second-conductivity-type well region;

a second-conductivity-type diffusion layer provided in the first-conductivity-type well region;

a first-conductivity-type diffusion layer provided in the second-conductivity-type well region; and at least one gate electrode layer; and each of the first PN diode, the second PN diode, and the first electrostatic discharge protection resistor included in the first buffer circuit being formed using at least one circuit element among the circuit elements included in each of the plurality of basic cells for the second circuit block.

2. The integrated circuit device as defined in claim 1, the integrated circuit device further including an electrostatic discharge protection circuit for noise blocking and electrostatic discharge protection that is provided between the first low-potential power supply and the second low-potential power supply, the electrostatic discharge protection circuit including a bidirectional diode formed by connecting at least one fifth diode and at least one the sixth diode in parallel, a forward direction of the at least one fifth diode being a direction from a power supply node connected to the first low-potential power supply to a power supply node connected to the second low-potential power supply, and a forward direction of the at least one sixth diode being a direction from the power supply node connected to the second low-potential power supply to the power supply node connected to the first low-potential power supply.

3. The integrated circuit device as defined in claim 1, the integrated circuit device further including:

a first inter-power-supply protection element provided between a power supply node connected to the first high-potential power supply and a power supply node connected to the first low-potential power supply; and a second inter-power-supply protection element provided between a power supply node connected to the second high-potential power supply and a power supply node connected to the second low-potential power supply.

4. The integrated circuit device as defined in claim 1, further comprising:

the first circuit block being a circuit block that includes a circuit formed using a semi-custom IC design method that designs a desired circuit by connecting a plurality of basic cells through wires;

each of the plurality of basic cells of the first circuit block including circuit elements that include at least:

a first-conductivity-type well region;

a second-conductivity-type well region;

a second-conductivity-type diffusion layer provided in the first-conductivity-type well region;

a first-conductivity-type diffusion layer provided in the second-conductivity-type well region; and at least one gate electrode layer; and each of the third PN diode, the fourth PN diode, and the second electrostatic discharge protection resistor included in the second buffer circuit being formed using at least one circuit element among the circuit elements included in each of the plurality of basic cells for the first circuit block.

5. The integrated circuit device as defined in claim 1, further comprising:

the first-conductivity-type well region being formed in the second-conductivity-type well region;

the at least one gate electrode layer being linearly provided along a first direction over the second-conductivity-type diffusion layer provided in the first-conductivity-type well region and the first-conductivity-type diffusion layer provided in the second-conductivity-type well region;

a wiring layer that forms the first signal path or the second signal path including a first wiring portion and a second wiring portion that are electrically connected and provided in parallel to the at least one gate electrode layer and;

the first wiring portion being connected to the second-conductivity-type diffusion layer provided in the first-conductivity-type well region through a plurality of contacts, an end of the first wiring portion being connected to the first-conductivity-type diffusion layer provided in the second-conductivity-type well region through a contact in a number smaller than a number of the plurality of contacts;

an end of the second wiring portion being connected to the first-conductivity-type diffusion layer provided in the second-conductivity-type well region through at least one contact;

the PN diode included in the first buffer circuit or the second buffer circuit being formed using a junction between the first-conductivity-type well region and the second-conductivity-type diffusion layer or a junction between the second-conductivity-type well region and the first-conductivity-type diffusion layer; and the first electrostatic discharge protection resistor or the second electrostatic discharge protection resistor being formed using the first-conductivity-type diffusion layer provided in the second-conductivity-type well region or the second-conductivity-type diffusion layer provided in the first-conductivity-type well region as a diffused resistor.

6. The integrated circuit device as defined in claim 5, further comprising:

an interval between the plurality of contacts that connect the first wiring portion of the wiring layer with the second-conductivity-type diffusion layer provided in the first-conductivity-type well region being smaller than an interval between the contact that connects the end of the first wiring portion with the first-conductivity-type diffusion layer provided in the second-conductivity-type well region and the contact that connects the end of the second wiring portion with the first-conductivity-type diffusion layer.

7. The integrated circuit device as defined in claim 1, further comprising:
   a gate insulating film of a transistor that forms the first input buffer or the second input buffer having a thickness larger than a thickness of a gate insulating film of at least one transistor that forms the first circuit block or the second circuit block.

8. The integrated circuit device as defined in claim 1, further comprising:
   a first-conductivity-type transistor that forms the first circuit block being formed in a second-conductivity-type well;
   a second-conductivity-type transistor that forms the first circuit block being formed in a first first-conductivity-type well, the first first-conductivity-type well being formed on a second-conductivity-type substrate to enclose the second-conductivity-type well;
   a second-conductivity-type transistor that forms the second circuit block being formed in a second first-conductivity-type well that differs from the first first-conductivity-type well of the first circuit block; and
   a first-conductivity-type transistor that forms the second circuit block being formed on the second-conductivity-type substrate.

9. The integrated circuit device as defined in claim 1, further comprising:
   the first circuit block being a high-speed interface circuit block that transfers data through a serial bus;
   the high-speed interface circuit block including a physical layer circuit that includes an analog circuit, and a logic circuit; and
   the second circuit block being a driver logic circuit block that generates a display control signal that drives a display device.

10. An electronic instrument comprising:
the integrated circuit device as defined in claim 1; and
a display device driven by the integrated circuit device.

* * * * *